(12) United States Patent
Hosono et al.

(10) Patent No.: US 10,868,043 B2
(45) Date of Patent: Dec. 15, 2020

(54) THIN FILM TRANSISTOR SUBSTRATE, METHOD FOR MANUFACTURING THE SAME, AND DISPLAY APPARATUS

(71) Applicant: Mitsubishi Electric Corporation, Tokyo (JP)

(72) Inventors: Akihiko Hosono, Kumamoto (JP); Kazunori Inoue, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/553,644

(22) Filed: Aug. 28, 2019

(65) Prior Publication Data

US 2020/0083257 A1   Mar. 12, 2020

(30) Foreign Application Priority Data

Sep. 12, 2018   (JP) .................................. 2018-170408

(51) Int. Cl.
| | |
|---|---|
| *H01L 27/12* | (2006.01) |
| *G02F 1/1362* | (2006.01) |
| *G02F 1/1343* | (2006.01) |
| *G02F 1/1333* | (2006.01) |

(52) U.S. Cl.
CPC ........ *H01L 27/1218* (2013.01); *G02F 1/1343* (2013.01); *G02F 1/136277* (2013.01); *G02F 1/136286* (2013.01); *H01L 27/127* (2013.01); *H01L 27/1262* (2013.01); *G02F 2001/133311* (2013.01)

(58) Field of Classification Search
None
See application file for complete search history.

(56) References Cited

U.S. PATENT DOCUMENTS

2015/0155373 A1*   6/2015   Yamazaki ......... H01L 29/66969
438/104

FOREIGN PATENT DOCUMENTS

WO   2013/080516 A1   6/2013

* cited by examiner

*Primary Examiner* — Edward J Glick
*Assistant Examiner* — David Y Chung
(74) *Attorney, Agent, or Firm* — Studebaker & Brackett PC

(57) ABSTRACT

A first oxide semiconductor layer of a pixel TFT has a first structure in which a first source electrode and a first drain electrode have, at both end portions thereof, two types of reduction action regions formed by the first oxide semiconductor layer protruding outward in a channel width direction of a first channel portion from both the first source electrode and the first drain electrode. A second oxide semiconductor layer of a drive circuit TFT has a second structure formed without protruding outward in a channel width direction of a second channel portion from a second source electrode and a second drain electrode. A protective insulation film is provided to cover the first oxide semiconductor layer, the first source electrode, and the first drain electrode.

9 Claims, 25 Drawing Sheets

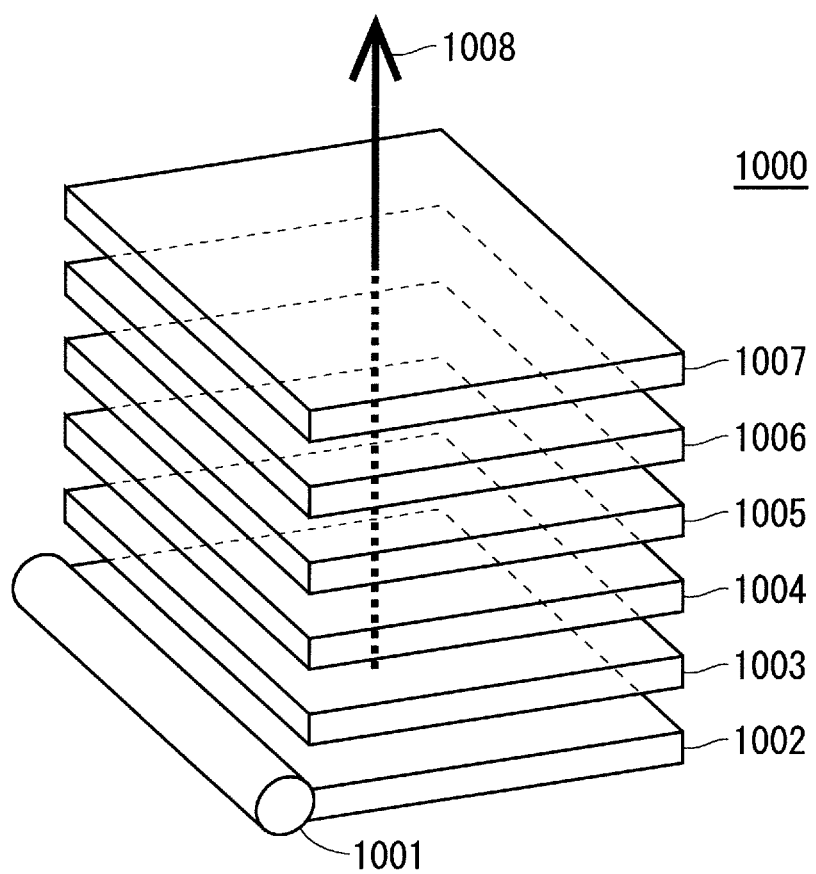
F I G. 1

F I G. 6
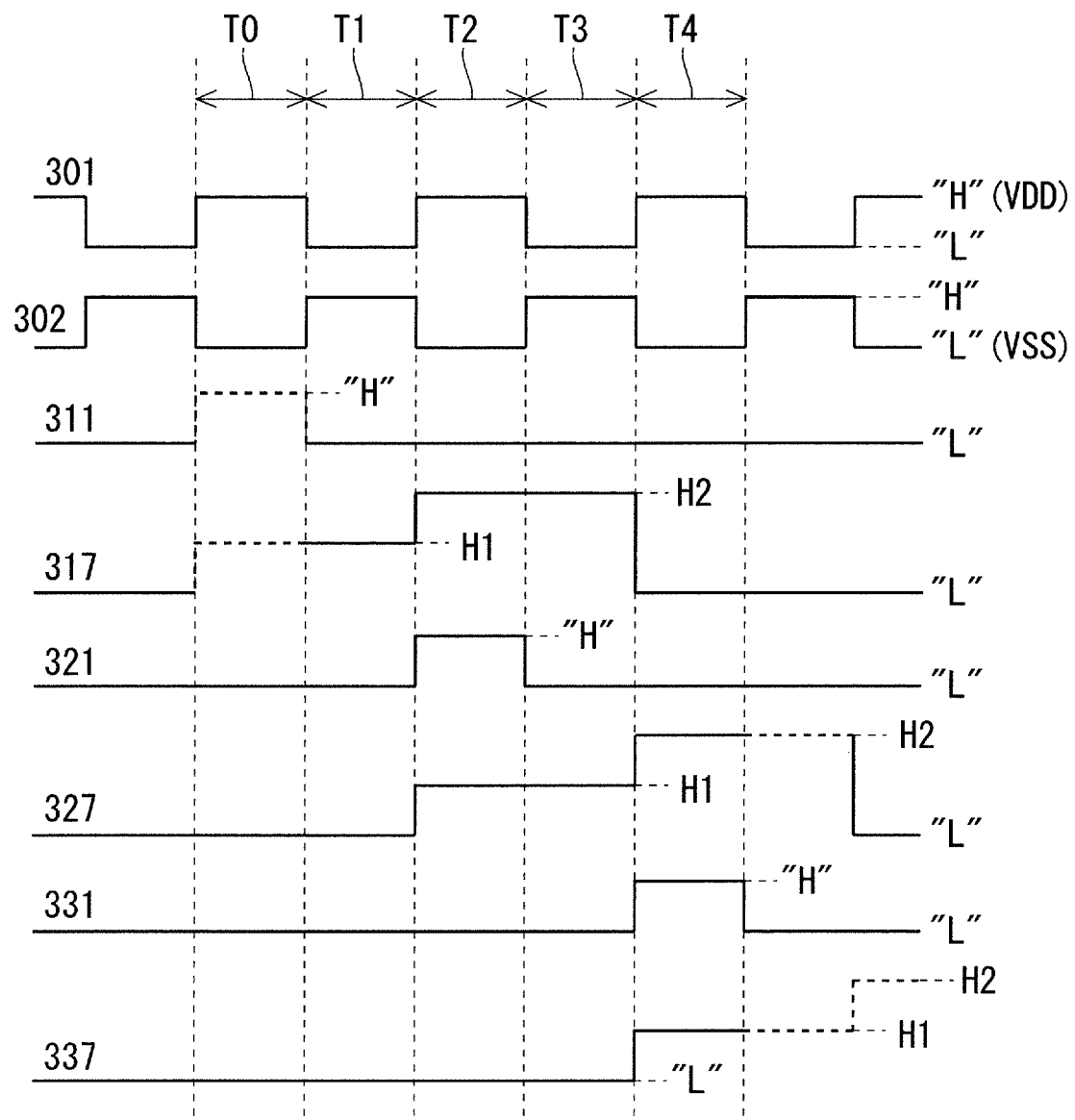

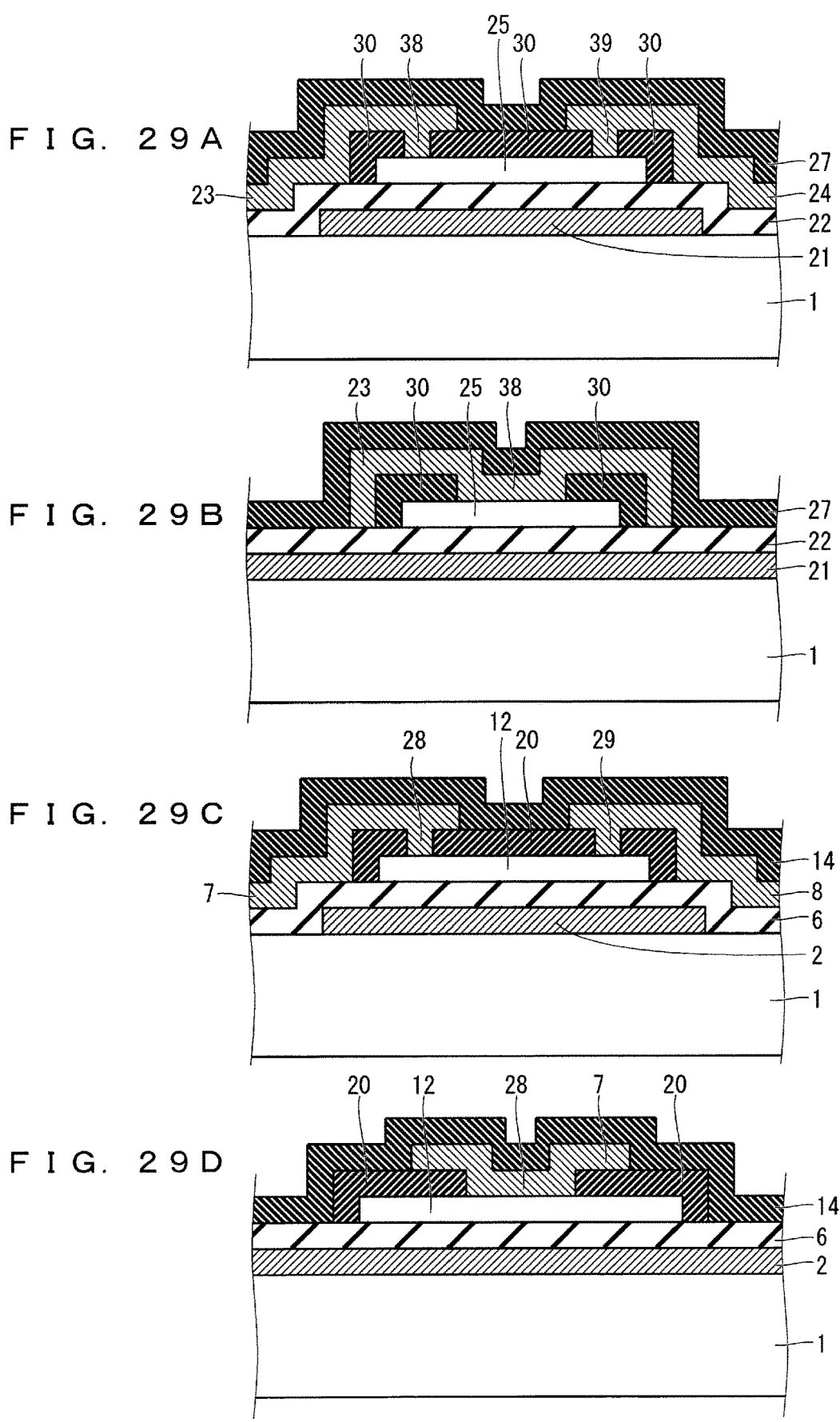

THIN FILM TRANSISTOR SUBSTRATE, METHOD FOR MANUFACTURING THE SAME, AND DISPLAY APPARATUS

BACKGROUND OF THE INVENTION

Field of the Invention

The present invention relates to a thin film transistor substrate having a pixel portion and a drive circuit on the same substrate, a method for manufacturing the same, and a display apparatus.

Description of the Background Art

A TFT active matrix substrate (hereinafter abbreviated as "TFT substrate") in which thin film transistors (hereafter referred to as "TFT") are formed in an array as a switching device is used in, for example, an electro-optical apparatus such as a liquid crystal display (hereafter referred to as "LCD").

A semiconductor device typified by a TFT is characterized by low power consumption and thinness. By taking advantage of such characteristics of the semiconductor device, an application to a flat panel display has been made in place of a cathode ray tube (CRT).

In an LCD used for a flat panel display, a liquid crystal layer is generally provided between a TFT substrate serving as a thin film transistor substrate and a counter substrate. A polarizing plate is provided on the outside of the TFT substrate and the counter substrate, respectively, and in a transmissive LCD and a semi-transmissive LCD, a backlight unit is provided on the further outside of the polarizing plate of the TFT substrate or an counter electrode. In a LCD of color display, for example, a color filter of one color or two or more colors is provided on the counter substrate, and good color display can be obtained.

Conventionally, in a switching device of a TFT substrate for a liquid crystal display, amorphous silicon (Si) is generally used for forming a channel layer which is an active layer of a semiconductor. In recent years, however, a TFT in which an oxide semiconductor is used for forming an active layer has been actively developed.

Since the oxide semiconductor has a higher mobility than the amorphous silicon, there is an advantage that a small-sized, high-performance TFT can be realized. As the oxide semiconductor, a zinc oxide (ZnO)-based material and a zinc oxide to which gallium oxide ($Ga_2O_3$), indium oxide ($In_2O_3$), tin oxide ($SnO_2$), or the like is added are mainly used.

A TFT using this oxide semiconductor layer can be formed at a relatively low temperature by sputtering or the like, and is easier to manufacture than a TFT using a semiconductor layer made of polycrystalline silicon (poly-Si). When a TFT using an oxide semiconductor layer is applied to an LCD, not only a pixel TFT constituting a pixel but also a drive circuit can be integrally formed on a TFT substrate.

The operational reliability of the drive circuit, and therefore the performance of the display apparatus, depends on the electrical characteristics of the drive circuit TFT, of which the threshold voltage is particularly important. In the drive circuit, it is often impossible to apply a negative gate voltage to the drive circuit TFT in order to realize a space-saving design in response to a demand for a narrow bezel of the display apparatus. Therefore, when the threshold voltage of the drive circuit TFT is a negative voltage value, it is difficult to control the TFT as a drive circuit, and even when the gate voltage is 0 V, there is a problem that a current flows between the source electrode and the drain electrode, that is, a so-called normally on state, thereby increasing power consumption. In view of this problem, the drive circuit TFT is required to have a characteristic that the threshold voltage is a positive voltage value.

On the other hand, it is possible to apply a negative gate voltage to the pixel TFT, and it is also possible to allow the pixel TFT to be in a more or less normally on state, so that a TFT having a negative threshold voltage can also be applied for the pixel TFT. The TFT having a negative threshold voltage has a smaller S value as a subthreshold coefficient and a sufficiently large ON current value than the TFT having a positive threshold voltage. Therefore, the pixel TFT preferably has a characteristic that the threshold voltage is a negative voltage value. Note that "S value" is precisely a subthreshold swing value that indicates a characteristic of the transistor, and the unit is "V/decade".

Since the required electrical characteristics are different between the pixel TFT and the drive circuit TFT in this manner, it is desirable to make the pixel TFT and the drive circuit TFT separately in accordance with the required electrical characteristics. Therefore, there has been proposed a configuration of a TFT substrate in which a plurality of types of TFTs having different electrical characteristics can be simultaneously formed on the same substrate, and, for example, PCT International Publication No. 2013/080516 discloses a technology related to the TFT substrate.

In the conventional TFT substrate as disclosed in PCT International Publication No. 2013/080516, the oxide semiconductor layer of the pixel TFT is partially covered over the entire channel width direction by the source electrode and the drain electrode. That is, in a formation region of the source electrode and the drain electrode, the source electrode and the drain electrode cover the entire channel width direction of the oxide semiconductor layer.

On the other hand, the oxide semiconductor layer of the drive circuit TFT protrudes outward in the channel width direction from at least one of the source electrode and the drain electrode. That is, in the formation region of the source electrode and the drain electrode, the source electrode and the drain electrode cover a part of the channel width direction of the oxide semiconductor layer. In the drive circuit TFT, a region of an oxide semiconductor layer protruding from a source electrode and a drain electrode is liable to be subjected to an oxidation action or a reduction action, in processes of a film forming treatment or an annealing treatment after forming the source electrode and the drain electrode. PCT International Publication No. 2013/080516 and the like describe that due to an influence of those actions, the carrier concentration of the oxide semiconductor layer of the drive circuit TFT is lower than the carrier concentration of the oxide semiconductor layer of the pixel TFT, and the threshold voltage is in a relatively high state.

In practice, however, when the region of the oxide semiconductor layer protruding from the source electrode and the drain electrode of the drive circuit TFT is subjected to the reduction action, on the contrary, the carrier concentration increases and the threshold voltage lowers. Therefore, there is a problem that it is difficult to make the threshold voltage of the drive circuit TFT higher than the threshold voltage of the pixel TFT, and when the threshold voltage of the drive circuit TFT is made positive, the threshold voltage of the pixel TFT inevitably becomes positive.

The conventional TFT substrate is configured as described above, and has a problem in that it is not possible to set an electrical characteristic in which the threshold voltage of the pixel TFT is set lower than the threshold voltage of the drive circuit TFT.

SUMMARY

An object of the present invention is to obtain a thin film transistor substrate in which a pixel portion and a drive circuit are formed on the same substrate by setting a threshold voltage of a pixel TFT lower than a threshold voltage of a drive circuit TFT.

A thin film transistor substrate of the present invention includes a pixel portion and a drive circuit.

The pixel portion is provided on a substrate, and the drive circuit is provided on the substrate to generate a pixel drive signal for driving the pixel portion.

The pixel portion includes a first transistor for pixel selection, and the drive circuit includes a second transistor for generating the pixel drive signal.

The first transistor includes a first gate electrode, a first gate insulation film, a first oxide semiconductor layer, a first source electrode, a first drain electrode, and a reduction promotion layer.

The first gate electrode is provided on the substrate, and the first gate insulation film is provided so as to cover the first gate electrode.

The first oxide semiconductor layer is provided on the first gate insulation film at a position facing the first gate electrode via the first gate insulation film.

The first source electrode is provided in contact with a part of a surface of the first oxide semiconductor layer.

The first drain electrode is provided in contact with a part of the surface of the first oxide semiconductor layer and is apart from the first source electrode. A region of the first oxide semiconductor layer between the first source electrode and the first drain electrode is defined as a first channel region.

The first oxide semiconductor layer has a first structure having a reduction action region in which a part of the first oxide semiconductor layer protrudes outward in a channel width direction of the first channel region from at least one electrode of the first source electrode and the first drain electrode.

The reduction promotion layer contains a reductant and is formed directly on at least a surface of the reduction action region.

The second transistor includes a second gate electrode, a second gate insulation film, a second oxide semiconductor layer, and a second source electrode.

The second gate electrode is provided on the substrate, and the second gate insulation film is provided so as to cover the second gate electrode.

The second oxide semiconductor layer is provided on the second gate insulation film at a position facing the second gate electrode via the second gate insulation film.

The second source electrode is provided in contact with a part of a surface of the second oxide semiconductor layer.

The second drain electrode is provided in contact with a part of the surface of the second oxide semiconductor layer and is apart from the second source electrode. A region of the second oxide semiconductor layer between the second source electrode and the second drain electrode is defined as a second channel region.

The second oxide semiconductor layer has a second structure formed without protruding outward in a channel width direction of the second channel region from the second source electrode and the second drain electrode.

In the thin film transistor substrate of the present invention, since the first transistor of the pixel portion has the first structure, the threshold voltage is set to the first threshold voltage at which the threshold voltage is lowered because the reduction action region of the first oxide semiconductor layer is subjected to the reduction action from the reduction promotion layer in the manufacturing stage.

The second transistor of the drive circuit has the second structure, and the first oxide semiconductor layer has no region protruding from the second source electrode and the second drain electrode in the channel width direction. That is, since there is no region corresponding to the reduction action region of the first transistor, the second transistor is set to a second threshold voltage higher than the first threshold voltage because the reduction action is not given from the reduction promotion layer via the region corresponding to the reduction action region.

As a result, the thin film transistor substrate of the present invention can achieve an advantageous effect that a pixel portion and a drive circuit can be formed on the same substrate such that the first threshold voltage of the first transistor of the pixel portion is lower than the second threshold voltage of the second transistor of the drive circuit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a perspective view schematically showing a configuration of a liquid crystal display including a TFT substrate according to a first preferred embodiment;

FIG. 6 is a timing chart showing an operation of the shift register shown in FIG. 5;

FIGS. 25A to 25D and FIGS. 29A to 29D are sectional views each showing a method for manufacturing a TFT substrate according to the second preferred embodiment.

DESCRIPTION OF THE PREFERRED EMBODIMENTS

First Preferred Embodiment (Liquid Crystal Display 1000)

FIG. 1 is a perspective view schematically showing the configuration of a liquid crystal display 1000 that includes a TFT substrate which is a thin film transistor substrate according to a first preferred embodiment. The configuration of the liquid crystal display 1000 will be described below with reference to FIG. 1.

As shown in FIG. 1, the liquid crystal display 1000 includes a light source 1001, a light guide plate 1002, a polarizing plate 1003, a TFT substrate 1004, a liquid crystal layer 1005, a counter substrate 1006, and a polarizing plate 1007 as main components.

The light source 1001 is a light source for the entire liquid crystal display 1000, and for example, a light-emitting diode or the like is used. A planar light guide plate 1002 guides light incident from the light source 1001 provided on the outside of one end face of the planar light guide plate 1002 so as to be emitted from the entire main surface of the light guide plate 1002. The light source 1001 and the light guide plate 1002 may be collectively referred to as a backlight unit.

The polarizing plate 1003, the TFT substrate 1004, the liquid crystal layer 1005, the counter substrate 1006, and the polarizing plate 1007 are arranged in this order on the main surface of the light guide plate 1002 on the light-emitting side. In this way, the liquid crystal layer 1005 is sandwiched between the counter substrate 1006 and the TFT substrate 1004.

Here, an outline of the operation of the liquid crystal display 1000 will be described. The TFT formed on the TFT substrate 1004 controls a polarization direction of the liquid crystal of the liquid crystal layer 1005 by controlling the electric field applied to the liquid crystal layer 1005 in response with signals from the outside and the drive circuit. By combining the TFT substrate 1004 with the polarizing plate 1003, the liquid crystal layer 1005, the counter substrate 1006, and the polarizing plate 1007, and by causing a light 1008 emitted from the light guide plate 1002 to pass through or be blocked for each pixel, a desired image can be displayed on the liquid crystal display 1000.

(TFT Substrate)

A TFT substrate 200 serving as the thin film transistor substrate of the first preferred embodiment will be described as an active matrix substrate in which TFTs serving as thin film transistors are arranged in a matrix as switching devices. As described with reference to FIG. 1, the TFT substrate 200 according to the first preferred embodiment is used as the TFT substrate 1004 in a flat display apparatus typified by a liquid crystal display, that is, a flat panel display or the like.

(Overall Configuration of TFT Substrate)

Figure 2:
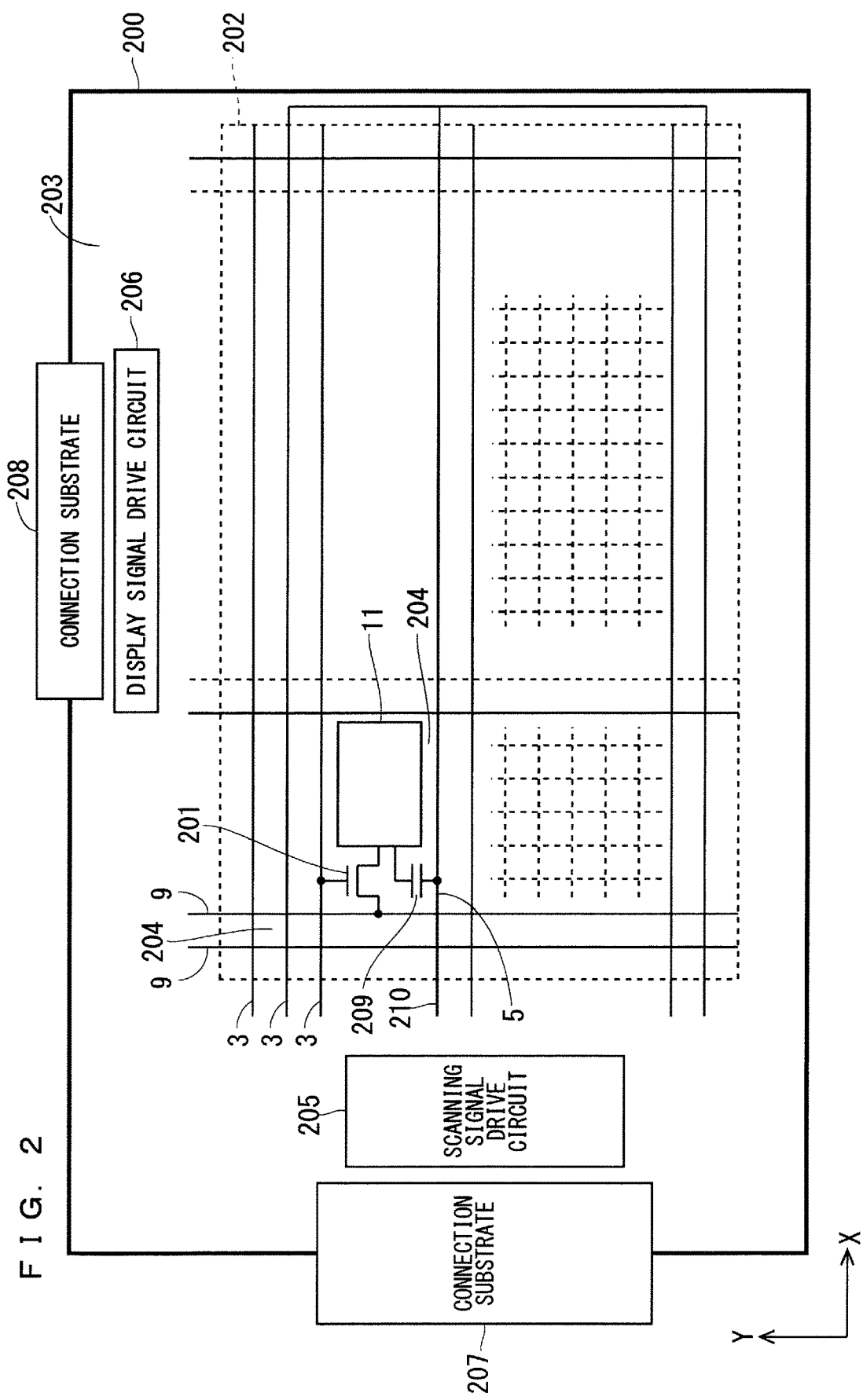
FIG. 2 is a plan view schematically illustrating an overall configuration of the TFT substrate of the first preferred embodiment.

FIG. 2 is a plan view schematically illustrating the overall configuration of the TFT substrate of the first preferred embodiment, and here a TFT substrate for an LCD is taken as an example. FIG. 2 shows an XY rectangular coordinate system.

The TFT substrate 200 shown in FIG. 2 corresponds to the TFT substrate 1004 shown in FIG. 1. The TFT substrate 200 is a TFT array substrate in which pixel TFTs 201 are arranged in a matrix, and is largely divided into a display region 202 and a bezel region 203 provided around the TFT substrate 200 so as to surround the display region 202.

In the display region 202, a plurality of gate wirings 3 and a plurality of auxiliary capacitance wirings 210, each serving as a scanning signal line, and a plurality of source wirings 9, each serving as a display signal line, are disposed.

The plurality of gate wirings 3 are disposed parallel to one another along an X direction, and the plurality of source wirings 9 are disposed parallel to one another along a Y direction so as to intersect with the plurality of gate wirings 3 perpendicularly. That is, as shown in FIG. 2, the gate wiring 3 is disposed so as to extend in the X direction, and the source wiring 9 is disposed so as to extend in the Y direction.

Since the region surrounded by the adjacent two gate wirings 3 and the adjacent two source wirings 9 forms a pixel 204, the TFT substrate 200 has a configuration in which the pixels 204 are arranged in a matrix. A pixel portion is configured by including all the regions to form the pixels 204 described above.

In FIG. 2, the configuration of some of the pixels 204 is enlarged, and at least one pixel TFT 201 is disposed in the pixel 204. The pixel TFT 201, which is a first transistor of the pixel portion, is arranged near the intersection between the source wiring 9 and the gate wiring 3, the gate electrode of the pixel TFT 201 is connected to the gate wiring 3, the source electrode of the pixel TFT 201 is connected to the source wiring 9, and the drain electrode of the pixel TFT 201 is connected to a transmissive pixel electrode 11. In this way, the pixel TFT 201 functions as a pixel selection transistor for selecting the transmissive pixel electrode 11.

One electrode of an auxiliary capacitance 209 is connected to the transmissive pixel electrode 11, and an auxiliary capacitance wiring 210 provided along the X direction parallel to each of the plurality of gate wirings 3 also serves as the other electrode of the auxiliary capacitance electrode.

A scanning signal drive circuit 205 and a display signal drive circuit 206 are provided in the bezel region 203 of the TFT substrate 200. The plurality of gate wirings 3 extend from the display region 202 to the bezel region 203 on the side where the scanning signal drive circuit 205 is provided, and although not shown in FIG. 2, the plurality of gate wirings 3 are connected to the scanning signal drive circuit 205 at the end portion of the TFT substrate 200.

Similarly, the plurality of source wirings 9 extend from the display region 202 to the bezel region 203 on the side where the display signal drive circuit 206 is provided, and although not shown in FIG. 2, the plurality of source wirings 9 are connected to the display signal drive circuit 206 at the end portion of the TFT substrate 200.

A connection substrate 207 to the outside is disposed near the scanning signal drive circuit 205, and a connection substrate 208 to the outside is disposed near the display signal drive circuit 206. The connection substrates 207 and 208 are, for example, wiring substrates such as flexible printed circuit (FPC).

Various external signals are supplied to the scanning signal drive circuit 205 and the display signal drive circuit 206 via the connection substrates 207 and 208, respectively. Based on a clock potential from the outside, the scanning signal drive circuit 205 plays a role of supplying a gate signal serving as a scanning signal to the plurality of gate wirings 3. The plurality of gate wirings 3 are sequentially selected by these gate signals.

The display signal drive circuit 206 supplies a display signal to the plurality of source wirings 9 based on an external control signal and display data. Thus, a display voltage corresponding to the display data can be supplied to each of the pixels 204. Conventionally, the display signal drive circuit 206 and the scanning signal drive circuit 205 have been formed by bonding a drive IC to a TFT substrate after forming the TFT substrate, but the display signal drive circuit 206 and the scanning signal drive circuit 205 in the TFT substrate of the first preferred embodiment are formed on the TFT substrate simultaneously with the pixel TFT.

The scanning signal drive circuit 205 and the display signal drive circuit 206 described above function as a drive circuit for generating a pixel drive signal for driving a pixel portion. The pixel drive signal includes the scanning signal and the display signal described above.

As will be described later with reference to a plan view, the auxiliary capacitance wiring 210 is configured so as to partially overlap the transmissive pixel electrode 11 in plan view, and the auxiliary capacitance 209 is formed with the transmissive pixel electrode 11 as one electrode and part of the auxiliary capacitance wiring 210 as the other electrode. A portion of the auxiliary capacitance wiring 210 in a region overlapping the transmissive pixel electrode 11 in plan view functions as an auxiliary capacitance electrode 5. All the auxiliary capacitance wirings 210 are electrically coupled outside the display region, and a common potential is supplied from, for example, the display signal drive circuit 206.

The pixel TFT 201 functions as a switching device for supplying a display voltage to the transmissive pixel electrode 11, and the ON state and the OFF state of the pixel TFT 201 are controlled by a gate signal input from the gate wiring 3. When a predetermined voltage is applied to the gate wiring 3 and the pixel TFT 201 is turned on, a current flows from the source wiring 9 electrically connected to the pixel TFT 201. As a result, a display voltage is applied from the source wiring 9 to the transmissive pixel electrode 11 connected to a drain electrode 8 of the pixel TFT 201, and an electric field corresponding to the display voltage is generated between the transmissive pixel electrode 11 and a counter electrode (not shown). Thus, the pixel TFT 201 is used for pixel selection.

A liquid crystal capacitance (not shown) is formed between the transmissive pixel electrode 11 and the counter electrode by a liquid crystal in parallel with the auxiliary capacitance 209. In the case of an in-plane-switching type liquid crystal display and a fringe-field-switching (FFS) type liquid crystal display, the counter electrode is arranged on the TFT substrate 200 side.

The display voltage applied to the transmissive pixel electrode 11 is held for a certain period by the liquid crystal capacitance and the auxiliary capacitance 209. An alignment film (not shown) may be formed on the surface of the TFT substrate 200.

As in the case of the counter substrate 1006 described with reference to FIG. 1, the counter substrate is arranged opposite to the TFT substrate 200. The counter substrate 1006 is, for example, a color filter substrate, and is arranged on a visual side. A color filter, a black matrix (BM), an alignment film, and the like are formed on the counter substrate 1006, and a counter electrode is also formed on the counter substrate 1006 depending on the method of the liquid crystal display.

Then, as described with reference to FIG. 1, the TFT substrate 1004 and the counter substrate 1006 are bonded to each other via a cell gap which is a constant gap. The TFT substrate 1004 corresponds to the TFT substrate 200 shown in FIG. 2.

Then, liquid crystal is injected into the above-described gap and sealed. That is, as shown in FIG. 1, the liquid crystal layer 1005 is arranged between the TFT substrate 1004 and the counter substrate 1006. The polarizing plates 1003 and 1007, retardation plates, and the like are provided on the outer surfaces of the TFT substrate 1004 and the counter substrate 1006. A backlight unit including the light source 1001 and the light guide plate 1002 is disposed on the side opposite to the visual side of the liquid crystal display configured as described above.

(Operation of Liquid Crystal Display)

The operation of the liquid crystal display 1000 will be further described with reference to FIGS. 1 and 2. When the liquid crystal of the liquid crystal layer 1005 is driven by the electric field between the transmissive pixel electrode 11 and the counter electrode, an alignment direction of the liquid crystal of the liquid crystal layer 1005 is changed. As a result, the polarization state of the light passing through the liquid crystal layer 1005 changes. That is, the polarization state of the light passing through the liquid crystal layer 1005 also changes after being linearly polarized through the polarizing plate 1003. Specifically, the light from the backlight unit including the light source 1001 and the light guide plate 1002 is linearly polarized by the polarizing plate 1003 on the TFT substrate 1004 side. As the linearly polarized light passes through the liquid crystal layer 1005, the polarization state changes.

Therefore, the amount of light passing through the polarizing plate 1007 on the counter substrate 1006 side changes depending on the polarization state, and hence on the electric field described above. That is, of the transmissive light transmitted from the backlight unit through the liquid crystal display, the amount of light of the light 1008 passing through the visual side polarizing plate 1007 can be changed by the electric field described above. In such a configuration, by controlling the display voltage for each pixel, a desired image can be displayed on the liquid crystal display.

(Configuration of Pixel of TFT Substrate)

Figure 3:
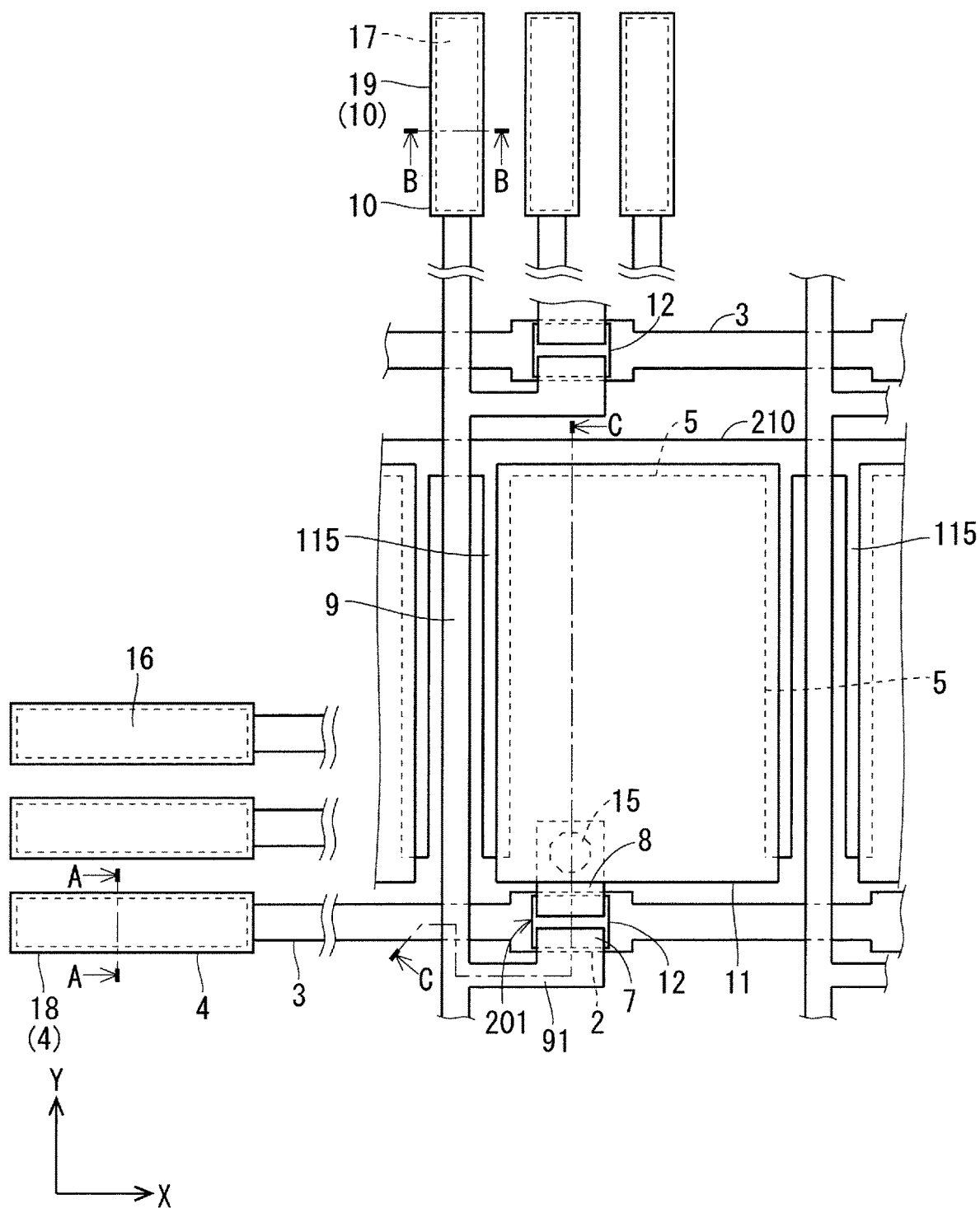
FIG. 3 is a plan view showing a planar configuration of a pixel portion shown in FIG. 2.
Figure 4:
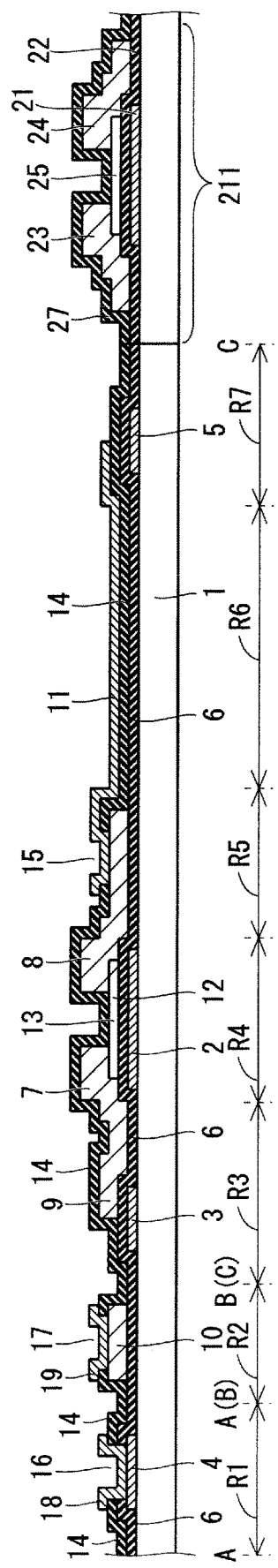
FIG. 4 is a sectional view schematically showing a sectional structure of FIG. 3.

FIG. 3 is a plan view showing a planar configuration of the pixel 204 shown in FIG. 2, and FIG. 4 is a sectional view schematically showing an A-A section, a B-B section, and a C-C section in FIG. 3. FIG. 3 shows an XY rectangular coordinate system. A protective insulation film 14 is not shown in FIG. 3.

In FIG. 4, a gate terminal region R1 corresponds to the A-A section of FIG. 3, and a source terminal region R2 corresponds to the B-B section of FIG. 3. Regions R3 to R7 shown in FIG. 4 correspond to the C-C section of FIG. 3, and the regions R3 to R7 are composed of a gate/source wiring crossing region R3, a pixel TFT region R4, a pixel/drain contact region R5, a pixel electrode region R6, and an auxiliary electrode region R7. Further, in FIG. 4, the sectional structure of a drive circuit TFT 211 in the scanning signal drive circuit 205 serving as the drive circuit is also shown at the right end in the figure.

The configuration of the TFT substrate 200 according to the first preferred embodiment will be described below with reference to FIGS. 3 and 4. Hereinafter, the TFT substrate 200 is assumed to be used in a transmissive liquid crystal display.

As shown in FIG. 3, the plurality of gate wirings 3 are arranged parallel to one another along the X direction. A part of each of the gate wirings 3 constitutes a gate electrode 2 and is disposed so as to extend in the X direction.

Main trunk lines of the plurality of auxiliary capacitance wirings 210 are disposed parallel to one another along the X direction. A part of each of the plurality of auxiliary capacitance wirings 210 constitutes the auxiliary capacitance electrode 5.

The plurality of source wirings 9 are disposed parallel to one another along the Y direction. In each of the plurality of source wirings 9, a branch wiring 91 that extends in the X direction branches, and its tip portion is superimposed on the gate electrode 2 to form a source electrode 7.

In a pixel region surrounded by the adjacent two gate wirings 3 and the adjacent two source wirings 9, the transmissive pixel electrode 11 defining a pixel of one unit is provided, and the transmissive pixel electrode 11 is connected to the drain electrode 8 via a pixel drain contact hole 15.

A portion of the gate wiring 3 whose width in the Y direction is wider than those of other portions functions as the gate electrode 2, an oxide semiconductor layer 12 whose constituent material is an oxide semiconductor is provided on the gate electrode 2, and the source electrode 7 and the drain electrode 8 are connected to the oxide semiconductor layer 12 in such a manner that parts of the source electrode 7 and the drain electrode 8 are in contact with the surface of the oxide semiconductor layer 12 with a gap therebetween.

The source electrode 7, the drain electrode 8, the gate electrode 2, and the oxide semiconductor layer 12 constitute the pixel TFT 201 as main components. During the operation of the pixel TFT 201, a channel portion 13 is formed in the oxide semiconductor layer 12 between the source electrode 7 and the drain electrode 8.

In the pixel region, the auxiliary capacitance wiring 210 has two branch wirings 115 that extend in the Y direction. The branch wirings 115 are provided at the portions corresponding to the two edge portions on the source wiring 9 side of the pixel region, and in the auxiliary capacitance electrode 5 serving as the other electrode of the auxiliary capacitance 209 of the auxiliary capacitance wiring 210, the main trunk line portion and the branch wiring 115, which are adjacent to the transmissive pixel electrode 11 and parallel to the X direction, have a shape of letter Π (Pi) in plan view. The auxiliary capacitance 209 shown in FIG. 2 is formed between the main trunk line portion of the auxiliary capacitance electrode 5 and the branch wiring 115 and the transmissive pixel electrode 11 overlapping the main trunk line portion and the branch wiring 115 in plan view.

As shown in FIG. 3, the shape of the auxiliary capacitance electrode 5 composed of the main trunk line portion and the branch wiring 115 is not limited to the shape of the letter Π, but may be linear or L-shaped as long as a desired auxiliary capacitance is obtained. Note that the "linear" is a structure in which the branch wiring 115 shown in FIG. 3 does not exist at all, and the "L-shaped" means a structure in which the branch wiring 115 is provided only at a portion corresponding to one edge portion on the source wiring 9 side of the pixel region.

The end portion of each of the plurality of gate wirings 3 extending to the bezel region 203 serves as a gate terminal 4, and the gate terminal 4 and a gate terminal pad 18 are connected via a gate terminal portion contact hole 16.

The gate terminal pad 18 provided above the gate terminal 4 is electrically connected to the scanning signal drive circuit 205 shown in FIG. 2, and a scanning signal can be supplied from the scanning signal drive circuit 205 to the plurality of gate wirings 3.

Similarly, the end portion of each of the plurality of source wirings 9 extending to the bezel region 203 serves as a source terminal 10, and the source terminal 10 and a source terminal pad 19 are connected via a source terminal portion contact hole 17.

An external video signal is supplied to the plurality of source terminals 10 via the source terminal pad 19 provided above the source terminal 10.

All the auxiliary capacitance wirings 210 are electrically coupled in the bezel region 203, and a common potential is applied thereto.

Next, the sectional configuration of the pixel 204 will be described with reference to FIG. 4. As shown in FIG. 4, the TFT substrate 200 according to the first preferred embodiment is formed on a substrate 1, which is a transparent insulation substrate made of, for example, glass, plastic, or the like, and the same conductive film is selectively disposed on the substrate 1 to constitute a wiring and an electrode.

That is, the gate electrode 2, the gate wiring 3, the gate terminal 4, and the auxiliary capacitance wiring 210 are composed of a single-layer film or a multi-layer film using, for example, aluminum (Al), chromium (Cr), copper (Cu), molybdenum (Mo), and an alloy or the like to which another element is added to these elements in a small amount.

An insulation film 6 is disposed so as to cover the gate electrode 2, the gate wiring 3, the gate terminal 4, and the auxiliary capacitance wiring 210. Since the insulation film 6 functions as a gate insulation film in a portion of the pixel TFT 201, it may be referred to as a gate insulation film 6. The gate insulation film 6 is composed of a laminated film of a silicon nitride film and a silicon oxide film formed thereon.

As shown in the pixel TFT portion of FIG. 4, in the pixel TFT region R4, the oxide semiconductor layer 12 is provided so as to face the gate electrode 2 via the gate insulation film 6. In the structure shown in FIGS. 3 and 4, the oxide semiconductor layer 12 is formed on the gate insulation film 6 so as to overlap the gate electrode 2 in plan view, and is provided so as to be contained within the region of the gate electrode 2 in plan view.

The oxide semiconductor layer 12 is formed of an oxide semiconductor as a constituent material, and an oxide semiconductor containing at least indium (In) and zinc (Zn), for example, an In-Zn-O-based oxide semiconductor where zinc oxide (ZnO), indium oxide ($In_2O_3$), and ZnO are compounded can be used as a constituent material. In addition to indium and zinc, other metals may be added.

Other metals include aluminium (Al), titanium (Ti), gallium (Ga), germanium (Ge), yttrium (Y), zirconium (Zr), silicon (Si), tin (Sn), lanthanum (La), cerium (Ce), and hafnium (Hf), and one or more types of these metals may be added. For example, it may be formed of an In-Ga-Zn-O-based oxide semiconductor, in which Ga is added to an In-Zn-O-based oxide semiconductor.

The conductivity of the oxide semiconductor layer 12 of the first preferred embodiment is, for example, $1 \times 10^{-7}$ to 10 S/cm. The carrier concentration of the oxide semiconductor layer is in a range within, for example, $1 \times 10^{11}$ to $1 \times 10^{18}$/$cm^3$. This is because when the conductivity is greater than 10 S/cm or when the carrier concentration is greater than $1 \times 10^{18}/cm^3$, the electric current easily flows at all times and the switching function as the semiconductor layer may not be exhibited. It is more preferable that the conductivity of the oxide semiconductor layer is in the range of, for example, $1\times10^{-4}$ to $10^0$ S/cm or the carrier concentration is in the range of, for example, $1\times10^{12}$ to $1\times10^{16}/cm^3$ after the device is formed. This carrier concentration range is higher than that of a semiconductor layer 25 in the drive circuit TFT 211 described later.

Then, on the oxide semiconductor layer 12, the source electrode 7 and the drain electrode 8 composed of a conductive film are disposed so as to be spaced apart from each other and in contact with the surface of the oxide semiconductor layer 12, and the channel portion 13 serving as a first channel region is formed in the oxide semiconductor layer 12 between the source electrode 7 and the drain electrode 8 during operation of the pixel TFT 201.

The source electrode 7 and the drain electrode 8 of the gate/source wiring crossing region R3, the pixel TFT region R4, and the pixel/drain contact region R5, the source wiring 9 and the branch wiring 91 of the gate/source wiring crossing region R3, and the source terminal 10 of the source terminal region R2 are covered with the protective insulation film 14. The protective insulation film 14 covers on the gate insulation film 6 of the gate terminal region R1 and also covers on the gate insulation film 6 of the pixel electrode region R6 and the auxiliary electrode region R7.

In the pixel electrode region R6, the transmissive pixel electrode 11 composed of a transparent conductive film is formed on the protective insulation film 14, and the transmissive pixel electrode 11 is connected to the drain electrode 8 via the pixel drain contact hole 15 that penetrates the protective insulation film 14 and reaches the drain electrode 8. The transmissive pixel electrode 11 extends from above the pixel drain contact hole 15 to above the auxiliary capacitance electrode 5, and the auxiliary capacitance 209 shown in FIG. 2 is formed between the transmissive pixel electrode 11 and the auxiliary capacitance electrode 5 including the branch wiring 115.

In the source terminal region R2, the source terminal pad 19 is connected to the source terminal 10 via the source terminal portion contact hole 17 that penetrates the protective insulation film 14 and reaches the source terminal 10. The source terminal pad 19 is electrically connected to the display signal drive circuit 206 shown in FIG. 2 so that a display signal can be supplied from the display signal drive circuit 206 to the source wiring 9.

In the gate terminal region R1, the gate terminal pad 18 is connected to the gate terminal 4 via the gate terminal portion contact hole 16 that penetrates the protective insulation film 14 and the gate insulation film 6 and reaches the gate terminal 4. The gate terminal pad 18 is electrically connected to the scanning signal drive circuit 205 shown in FIG. 2 so that a scanning signal can be supplied from the scanning signal drive circuit 205 to the gate wiring 3.

(Configuration of Drive Circuit of TFT Substrate)

Figure 5:
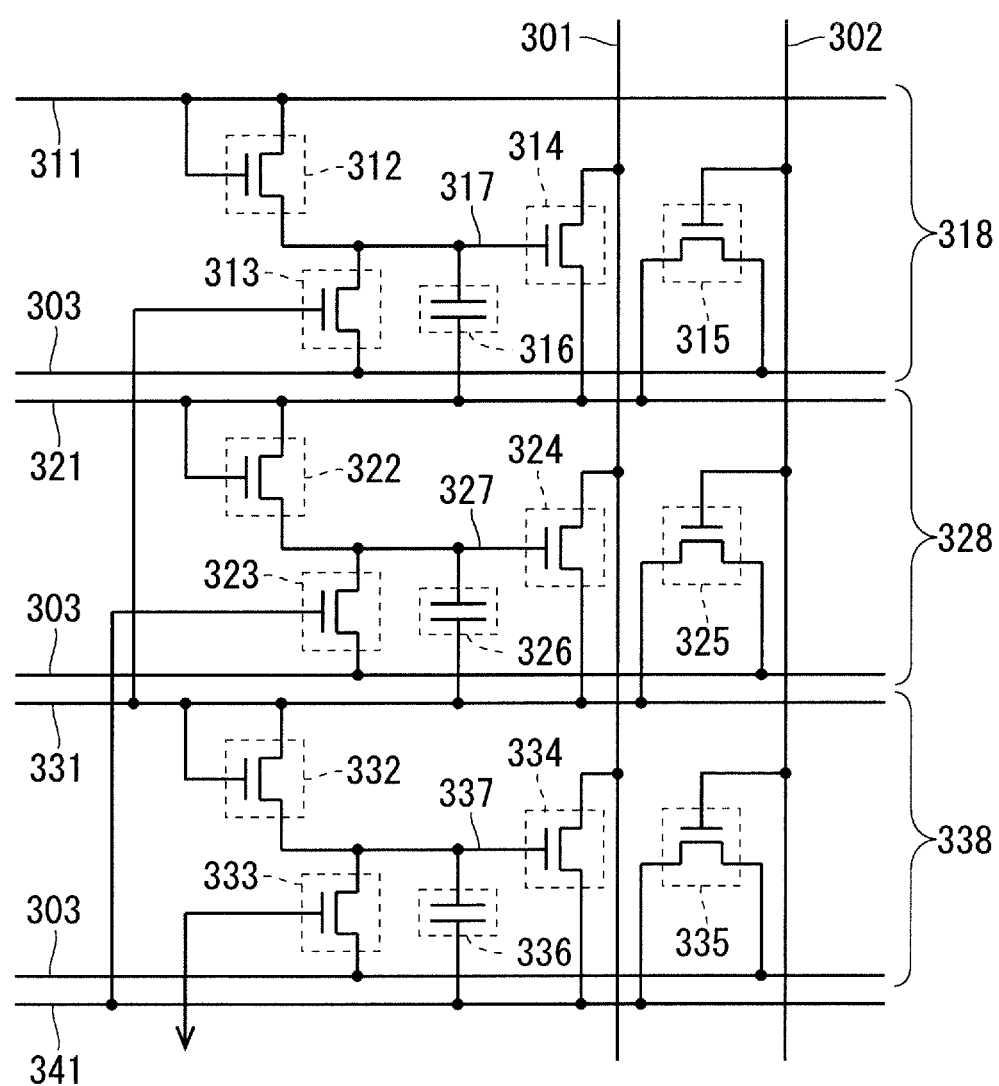
FIG. 5 is a circuit diagram showing a form of a shift register used for a part of a scanning signal drive circuit.

FIG. 5 is a circuit diagram showing a form of a shift register used for a part of the scanning signal drive circuit 205. FIG. 6 is a timing chart showing the operation of the shift register shown in FIG. 5.

The shift register in the scanning signal drive circuit 205 will be described below with reference to FIGS. 5 and 6. A form of the shift register shown in FIG. 5 can also be used for the display signal drive circuit 206.

The scanning signal drive circuit 205 includes a shift register 212 shown in FIG. 5. In some cases, the scanning signal drive circuit 205 may include a level shifter, a buffer, or the like. In the scanning signal drive circuit 205, a clock signal and a start pulse signal (not shown) are input to the shift register 212 to generate a selection signal. The generated selection signal is buffered and amplified in the buffer and supplied to the corresponding gate wiring 3. A gate electrode of the pixel TFT 201 for one line is connected to the gate wiring 3. Since the pixel TFTs 201 for one line have to be turned on simultaneously, the buffer that is capable of passing a large current is used.

FIG. 5 shows three scanning drive circuits 318 to 338 each serving as a pulse output circuit. The shift register 212 is configured including these scanning drive circuits 318 to 338.

FIGS. 5 and 6 show the configuration and operation of the scanning drive circuits 318 to 338, which are three-stage pulse output circuits, but the actual LCD product is not limited to those of three stages. In general, the number of stages of the shift register corresponds to the number of scanning lines.

The shift register 212 has TFTs 312, 322, and 332 for precharging internal nodes 317, 327, and 337 of the shift register 212, TFTs 313, 323, and 333 for discharging charges on the internal nodes 317, 327, and 337, and TFTs 314, 324, and 334 for supplying signals to gate lines 321, 331, and 341.

A gate electrode 21 includes TFTs 315, 325, and 335 for holding the potentials of the gate lines 321, 331, and 341, and capacitances 316, 326, and 336 formed between the internal nodes 317, 327, and 337 and the gate lines 321, 331, and 341.

Also, clock signal lines 301 and 302 for driving the shift register 212, and a Low potential wiring 303 fixed at the potential of "L", which is the ground level VSS, are connected to the shift register 212. The clock signal lines 301 and 302 are alternately supplied with "H" and "L" which are a power supply potential VDD for each gate selection period.

The scanning drive circuits 318 to 338 in the shift register 212 have the same configuration. Hereinafter, the circuit configuration will be described as a representative of the scanning drive circuit 318.

One electrode and a gate electrode of the TFT 312 are connected to the gate line 311, and the other electrode of the TFT 312 serves as the internal node 317. One electrode of the TFT 313 is connected to the internal node 317, the other electrode of the TFT 313 is connected to the Low potential wiring 303, and the gate electrode is connected to the gate line 331 of the scanning drive circuit 338.

One electrode of the capacitance 316 is connected to the internal node 317, and the other electrode of the capacitance 316 is connected to the gate line 321 of the scanning drive circuit 328. The gate electrode of the TFT 314 is connected to the internal node 317, one electrode of the TFT 314 is connected to the clock signal line 301, and the other electrode is connected to the gate line 321 of the scanning drive circuit 328.

The gate electrode of the TFT 315 is connected to the clock signal line 302. One electrode of the TFT 315 is connected to the gate line 321 of the scanning drive circuit 328, and the other electrode is connected to the Low potential wiring 303.

The scanning drive circuit 328 has substantially the same circuit configuration as that of the scanning drive circuit 318, and the components 321 to 327 correspond to the components 311 to 317 of the scanning drive circuit 318, respectively. The scanning drive circuit 338 has substantially the same circuit configuration as that of the scanning drive circuit 318, and the components 331 to 337 correspond to the components 311 to 317 of the scanning drive circuit 318, respectively.

The operation of the shift register 212 shown in FIG. 5 will be described below with reference to FIG. 6.

First, in a period T0 half a clock before a gate selection period T1, the clock signal line 301 is "H" of the power supply potential VDD, the clock signal line 302 is "L" of the ground level VSS, and the gate line 311 is selectively "H". In this period T0, the gate signal of "H" is input to the gate electrode of the TFT 312 via the gate line 311 of the scanning drive circuit 318, and the internal node 317 is precharged to a potential H1.

Thereafter, in the period T1, the clock signal line 301 is switched to "L" and the clock signal line 302 is switched to "H". Accordingly, the TFTs 314 and 315 are turned on, but the gate line 321 of the scanning drive circuit 328 is set to "L" because the clock signal line 301 is "L".

In a next period T2, the clock signal line 301 is switched to "H" and the clock signal line 302 is switched to "L". At this time, since the TFT 314 is on and the TFT 315 is off, the "H" of the clock signal line 301 is charged to the gate line 321.

As the gate line 321 is charged, the internal node 317 is raised to a higher potential via the capacitance 316, and the potential H1 rises to a potential H2. As a result, a sufficiently high voltage for charging the gate line 321 to "H" can be applied to the gate electrode of the TFT 314. During this period T2, the "H" signal of the gate line 321 is input to the scanning drive circuit 328, and the internal node 327 is precharged to the potential H1 via the TFT 322 that is in the ON state.

In a next period T3, the clock signal line 301 is switched to "L". The clock signal line 302 is switched to "H". Thus, the gate line 321 is discharged to "L" via the TFT 315.

In a next period T4, the clock signal line 301 is switched to "H", and the clock signal line 302 is switched to "L". At this time, since the TFT 324 is on and the TFT 325 is off, the "H" of the clock signal line 301 is charged to the gate line 331.

As the gate line 331 is charged, the internal node 327 is raised to a higher potential via the capacitance 326, and the potential H1 rises to the potential H2. A sufficiently high voltage for charging the gate line 331 to "H" can be applied to the gate electrode of the TFT 324.

Since the gate line 331 is charged to "H" in the period T4, the TFT 313 of the scanning drive circuit 318 is turned on, and the internal node 317 is discharged to "L" to complete a potential setting operation of the gate line 321.

Thereafter, until the operation is performed again in the next frame, "L" is input to the gate line 321 via the TFT 315 in accordance with the operation of the clock signal line 302, and the "L" state is maintained. As described above, the scanning drive circuits 318 to 338 are each constituted as one stage of the shift register 212 by four TFTs and one capacitance, and scanning signals of a plurality of stages are supplied from the scanning signal drive circuit 205 to the plurality of gate wirings 3 based on the clock signal lines 301 and 302 without receiving an external control signal.

The drive circuit TFT 211 shown in FIG. 4 is used for configuring the TFTs 312, 313, 314, and 315 of the scanning drive circuit 318, the TFTs 322, 323, 324, and 315 of the scanning drive circuit 328, and the TFTs 332, 333, 334, and 335 of the scanning drive circuit 338, respectively. That is, the drive circuit TFT 211 functions as a transistor for generating a pixel drive signal.

At this time, if a TFT in the normally on state is used as the drive circuit TFT 211, it is necessary to keep writing "L" from the TFTs 315, 325, and 335 in order for the gate lines 311, 321, and 331 to maintain "L", for example. Therefore, power consumption increases.

If a TFT in the normally off state is used as the drive circuit TFT 211, it is not necessary to keep writing a Low potential from the TFTs 315, 325, and 335, so that if the off-leakage current of the drive circuit TFT 211 is small, the TFTs 315, 325, and 335 can be omitted, and further space saving and a narrower bezel of the LCD can be realized.

If the rise of the gate voltage is 0 V or more, the ground level VSS can be set to 0 V. In this case, since the ground voltage of 0 V can be used as the off voltage, the configuration for generating the off voltage is not necessary, and the circuit configuration can be simplified, thereby reducing the circuit load.

(Drive Circuit TFT 211)

The sectional configuration of the drive circuit TFT 211 will be described below with reference to FIG. 4. As shown in FIG. 4, the TFT substrate 200 is formed on the substrate 1, which is a transparent insulation substrate made of, for example, glass, plastic, or the like, and a same conductive film is selectively disposed on the substrate 1 to constitute a wiring and an electrode.

That is, the gate electrode 21 is composed of a single-layer film or a multi-layer film using, for example, aluminum, chromium, copper, molybdenum, and an alloy or the like to which another element is added to these elements in a small amount.

An insulation film 22 is disposed so as to cover them. Since the insulation film 22 functions as a gate insulation film, it may be referred to as a gate insulation film 22. The gate insulation film 22 is composed of a laminated film of a silicon nitride film and a silicon oxide film formed thereon.

In the formation region of the drive circuit TFT 211, the oxide semiconductor layer 25 is provided so as to face the gate electrode 21 via the gate insulation film 22. In the structure shown in FIG. 4, the oxide semiconductor layer 25 is formed on the gate insulation film 22 so as to overlap the gate electrode 21 in plan view, and is arranged so as to be contained within the region of the gate electrode 21 in plan view.

The oxide semiconductor layer 25 is formed of an oxide semiconductor as a constituent material, and an oxide semiconductor containing at least indium (In) and zinc (Zn), for example, an In-Zn-O-based oxide semiconductor where zinc oxide (ZnO), indium oxide ($In_2O_3$), and ZnO are compounded can be used.

In addition to indium and zinc, other metals may be added. Other metals include Al, Ti, Ga, Ge, Y, Zr, Si, Sn, La, Ce, and Hf, and one or more types of these metals may be added. For example, it may be formed of an In-Ga-Zn-O-based oxide semiconductor, in which Ga is added to an In-Zn-O-based oxide semiconductor.

The conductivity of the oxide semiconductor layer 25 of the first preferred embodiment is, for example, $1 \times 10^{-7}$ to 10 S/cm. The carrier concentration of the oxide semiconductor layer is in a range within, for example, $1 \times 10^{11}$ to $1 \times 10^{18}$/$cm^3$. This is because when the conductivity is greater than 10 S/cm or when the carrier concentration is greater than $1 \times 10^{18}$/$cm^3$, the electric current easily flows at all times and the switching function as the semiconductor layer may not be exhibited. It is more preferable that the conductivity of the oxide semiconductor layer 25 is in the range of, for example, $1\times10^{-4}$ to $10^{-1}$ S/cm or the carrier concentration is in the range of, for example, $1\times10^{11}$ to $1\times10^{14}/cm^3$ after the device is formed.

By using the oxide semiconductor layer 25 as a channel layer having a channel portion 26, a TFT having a mobility higher than that of amorphous silicon in the normally off state can be realized, and the operation speed can be improved.

Then, on the oxide semiconductor layer 25, a source electrode 23 and a drain electrode 24 composed of a conductive film are disposed so as to be spaced apart from each other and in contact with the surface of the oxide semiconductor layer 25, and the channel portion 26 is formed in the oxide semiconductor layer 25 between the source electrode 23 and the drain electrode 24 during operation of the drive circuit TFT 211. The channel portion 26 is formed such that the channel width and the channel length are substantially the same as those of the channel portion 13 and the formation area of the channel portion 26 is substantially the same as that of the channel portion 13.

The source electrode 23, the drain electrode 24, and the oxide semiconductor layer 25 of the drive circuit TFT 211 are covered with a protective insulation film 27.

In configuring the shift register 212 as shown in FIG. 5, a plurality of the drive circuit TFTs 211, the clock signal lines 301 and 302, the Low potential wiring 303, and the gate lines 311, 321, 331, and 341 are disposed in combination.

(Configuration of First Preferred Embodiment)

For the first preferred embodiment, a case of using a back channel etch type TFT is shown.

Figure 7A:
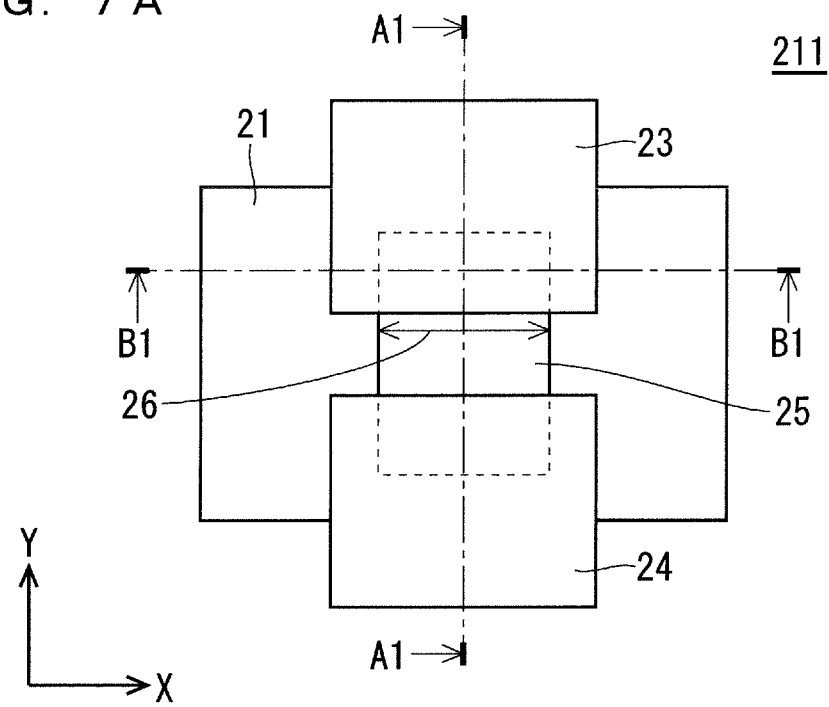
FIGS. 7A and 7B are plan views each showing a planar structure of a pixel TFT and a drive circuit TFT according to the first preferred embodiment.
Figure 7B:
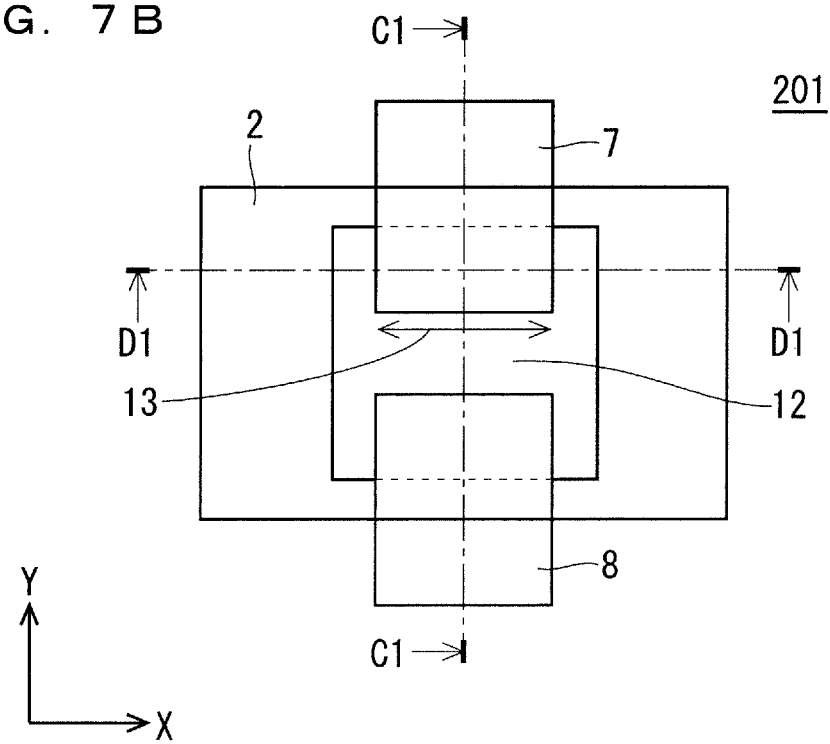

FIGS. 7A and 7B are plan views each showing a planar structure of the pixel TFT 201, which is the first transistor according to the first preferred embodiment, and the drive circuit TFT 211, which is the second transistor. FIG. 7A shows a plan view of the drive circuit TFT 211, and FIG. 7B shows a plan view of the pixel TFT 201. FIGS. 7A and 7B each show an XY rectangular coordinate system. FIG. 7A does not illustrate the protective insulation film 27, and FIG. 7B does not illustrate the protective insulation film 14.

Figure 8:
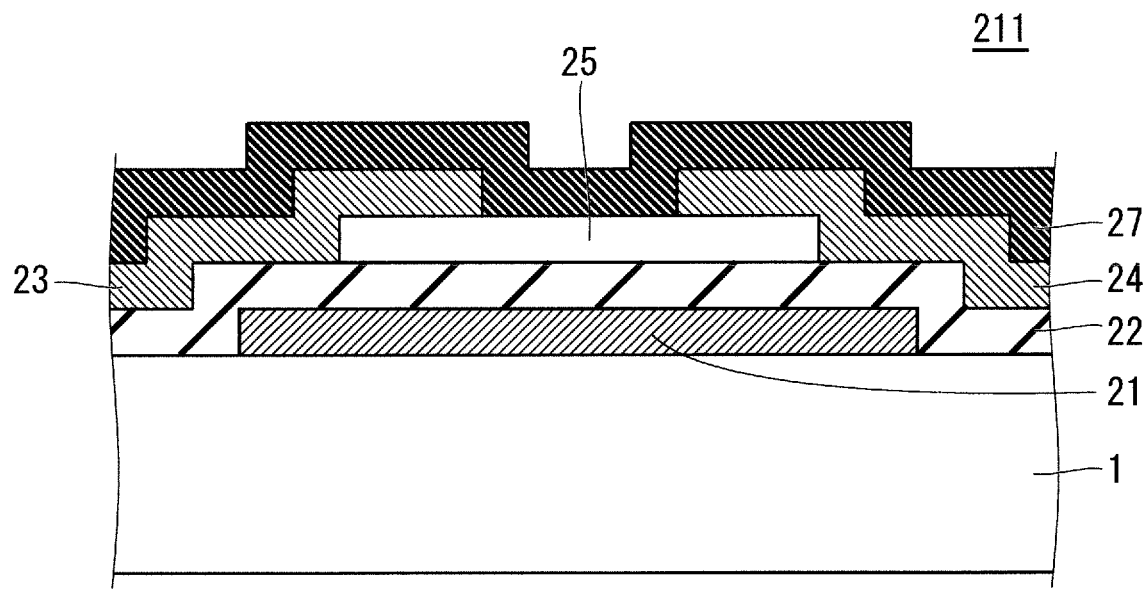
FIG. 8 is a sectional view (part 1) showing a sectional structure of the drive circuit TFT shown in FIGS. 7A and 7B.
Figure 9:
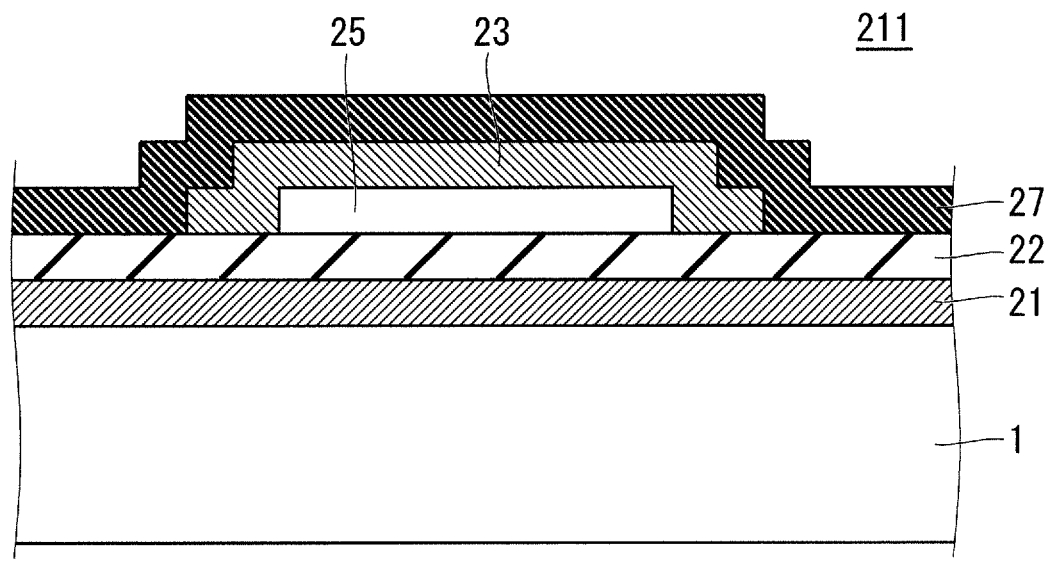
FIG. 9 is a sectional view (part 2) showing a sectional structure of the drive circuit TFT shown in FIGS. 7A and 7B.

FIGS. 8 and 9 are sectional views each showing a sectional structure of the drive circuit TFT 211. FIG. 8 shows a sectional structure taken along line A1-A1 in FIG. 7A, and FIG. 9 shows a sectional structure taken along line B1-B1 in FIG. 7A.

Figure 10:
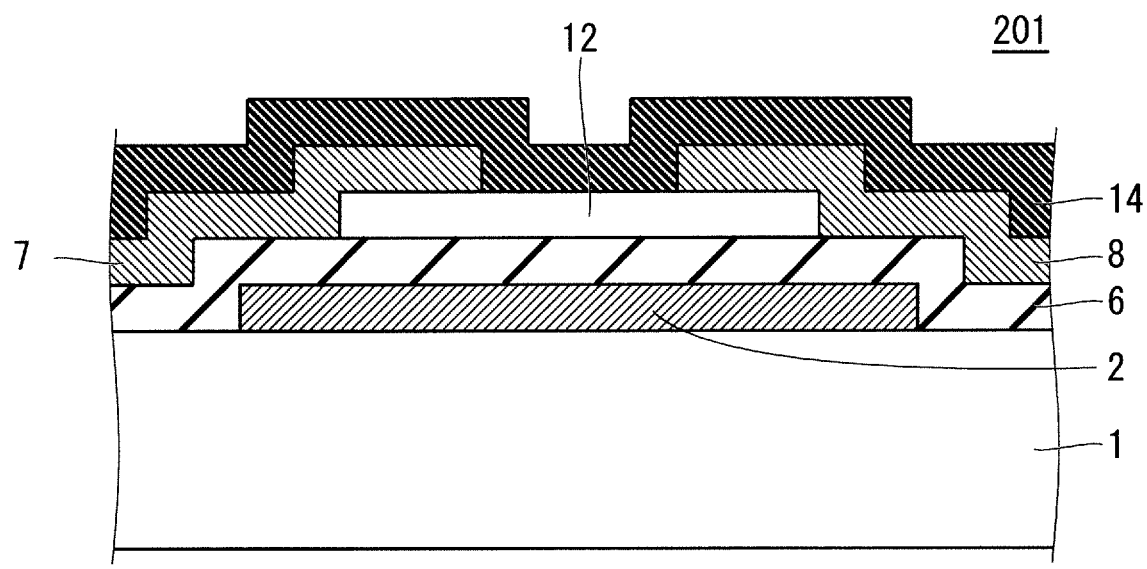
FIG. 10 is a sectional view (part 1) showing a sectional structure of the pixel TFT shown in FIGS. 7A and 7B.
Figure 11:
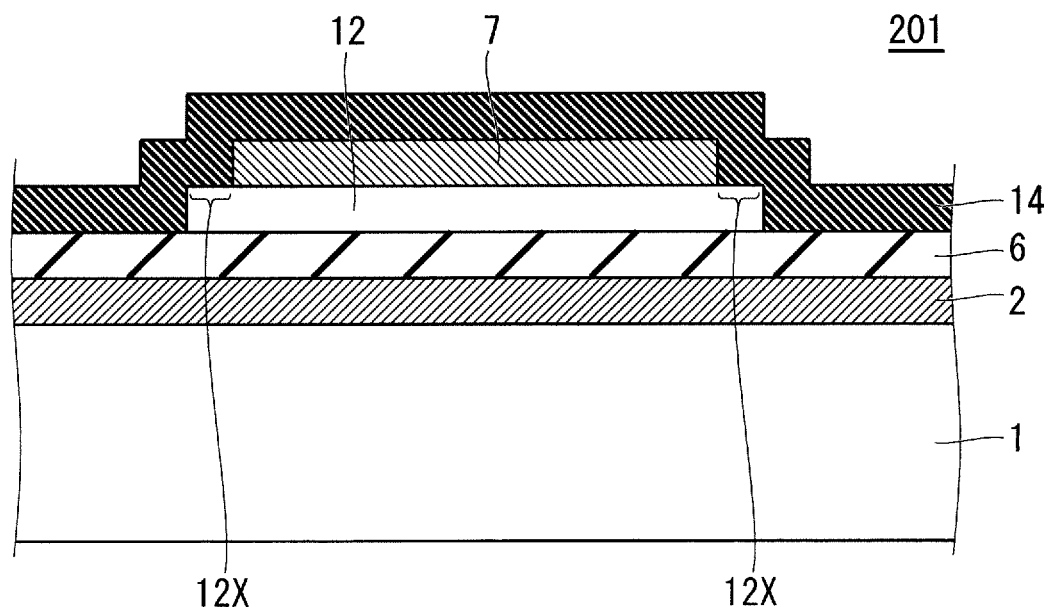
FIG. 11 is a sectional view (part 2) showing a sectional structure of the pixel TFT shown in FIGS. 7A and 7B.
Figure 12A:
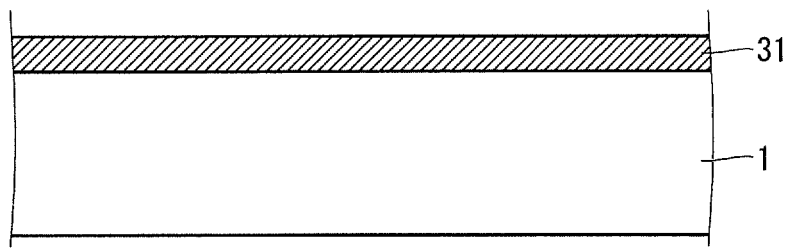
FIGS. 12A to 12D to FIGS. 19A to 19D are sectional views each showing a method for manufacturing the TFT substrate according to the first preferred embodiment.
Figure 12B:
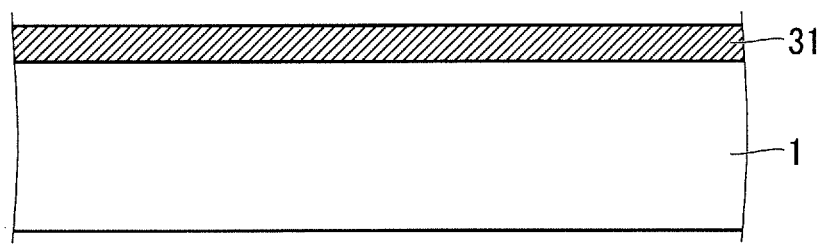
Figure 12C:
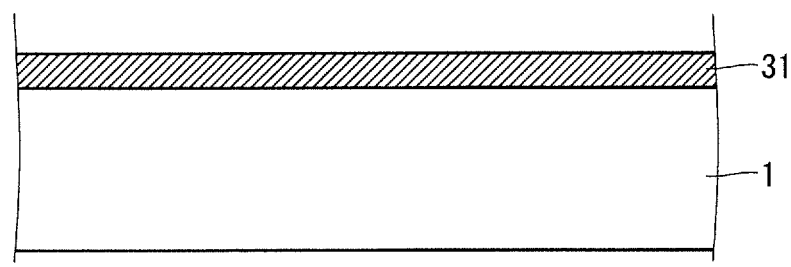
Figure 12D:
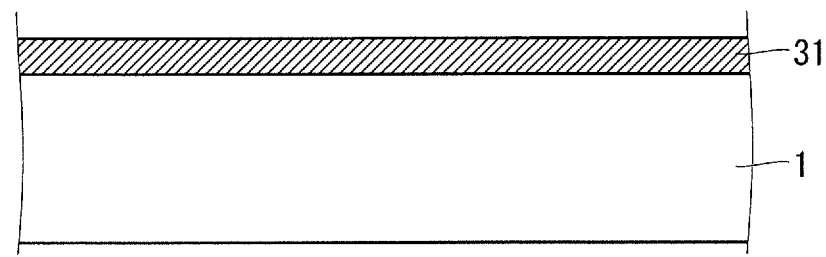
Figure 13A:
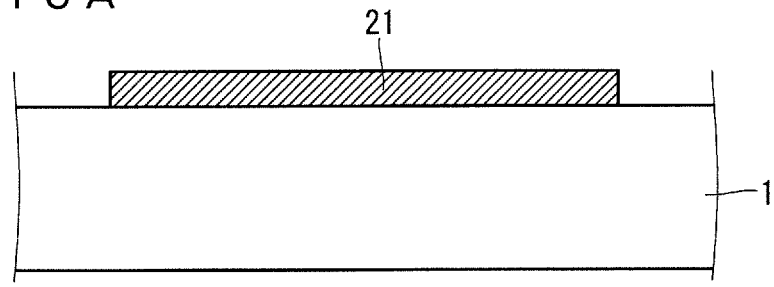
Figure 13B:
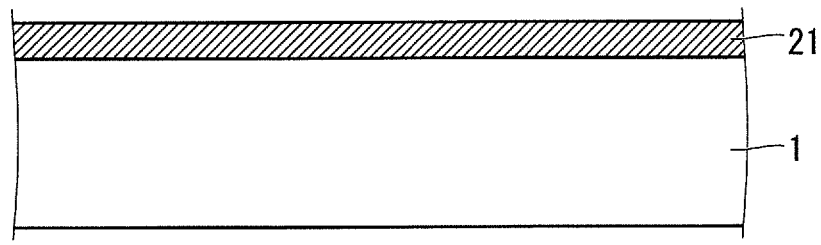
Figure 13C:
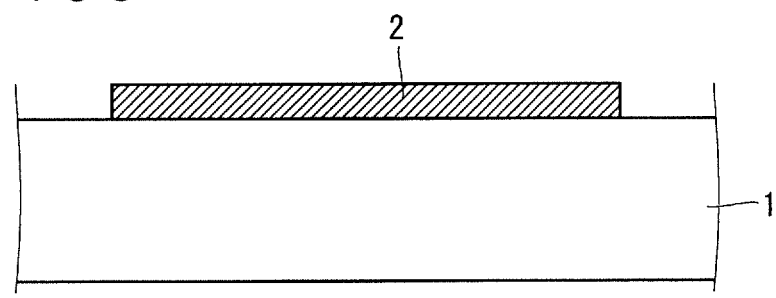
Figure 13D:
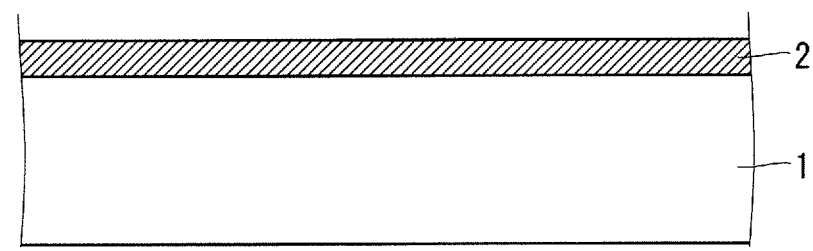
Figure 14A:
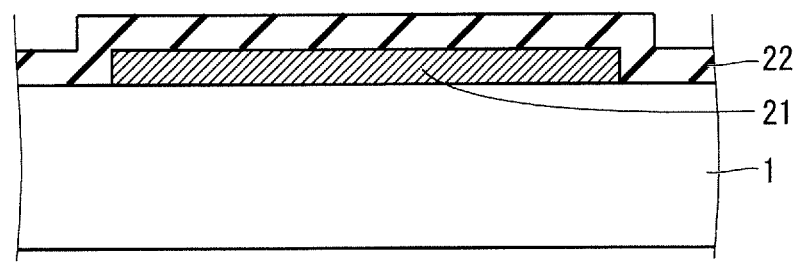
Figure 14B:
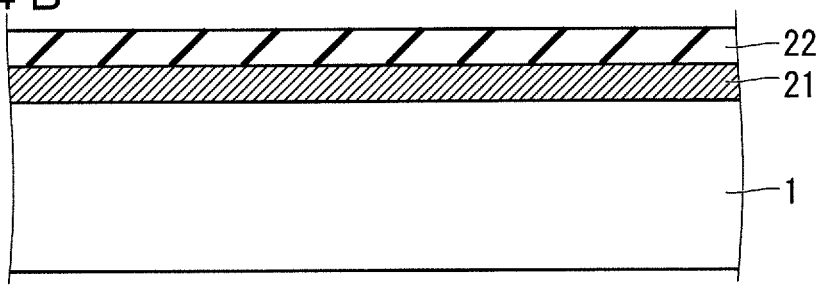
Figure 14C:
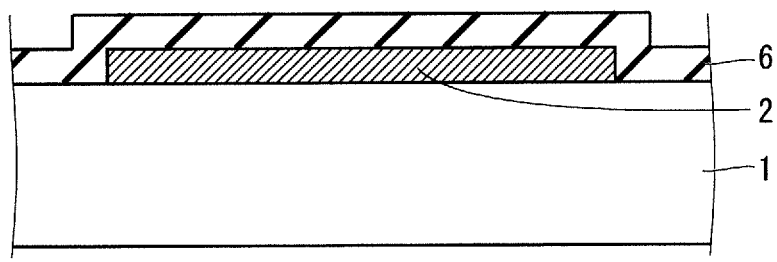
Figure 14D:
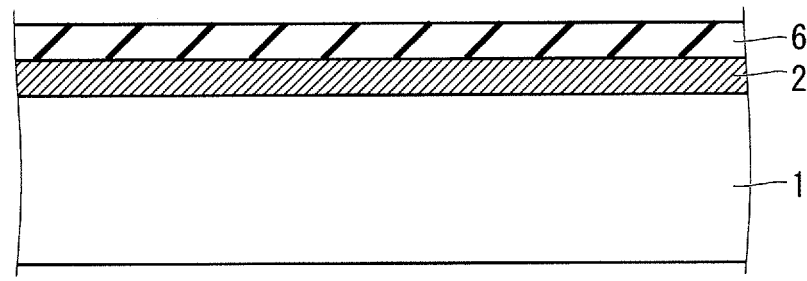
Figure 15A:
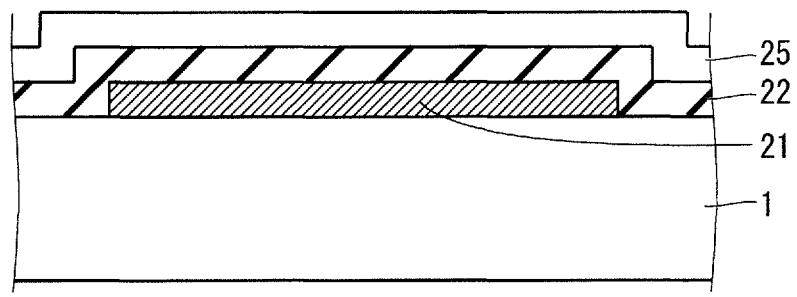
Figure 15B:
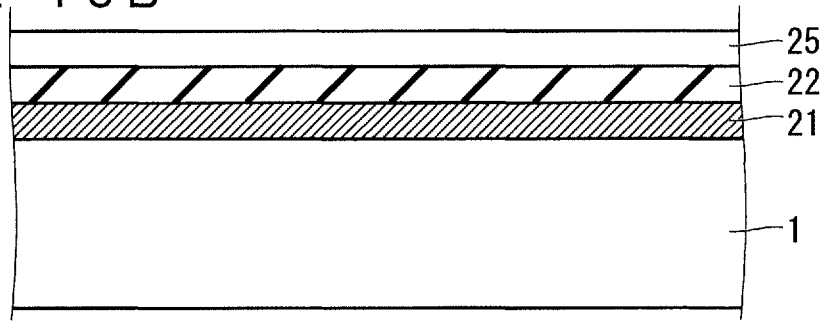
Figure 15C:
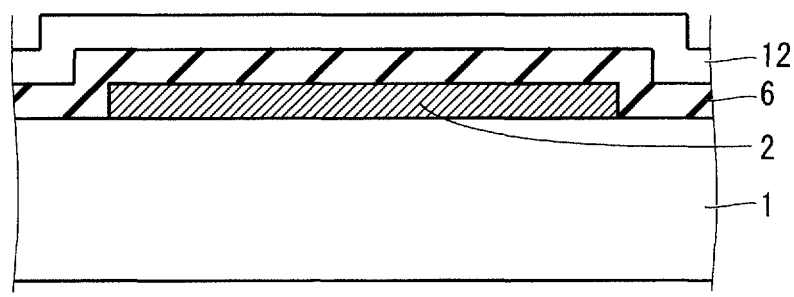
Figure 15D:
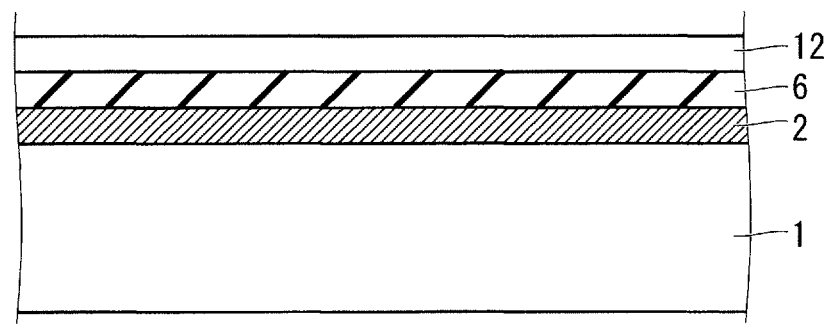
Figure 16A:
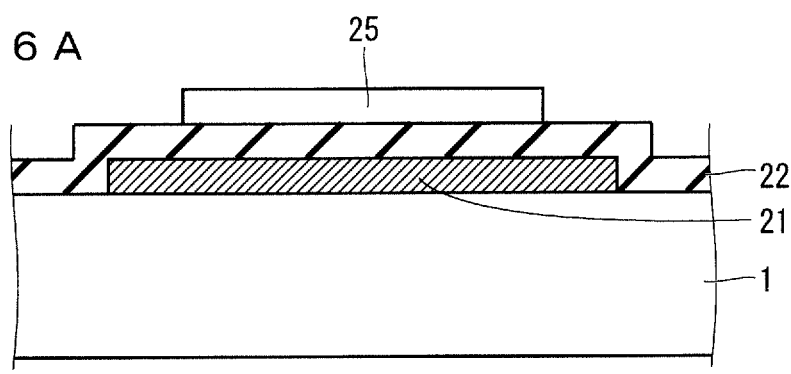
Figure 16B:
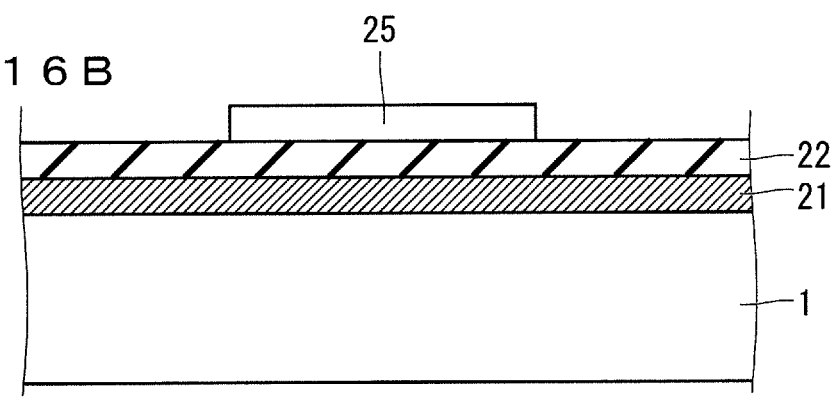
Figure 16C:
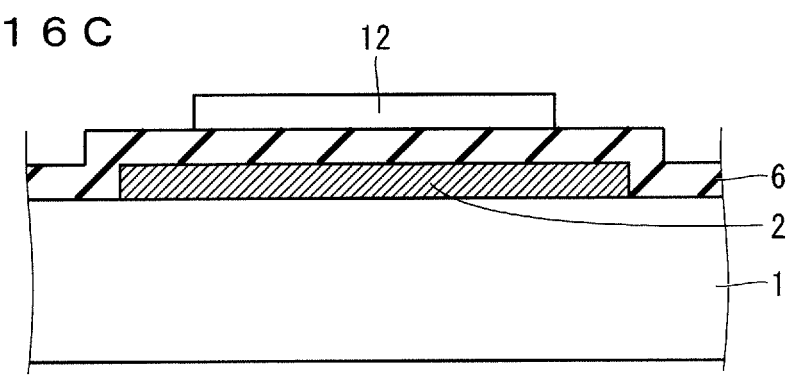
Figure 16D:
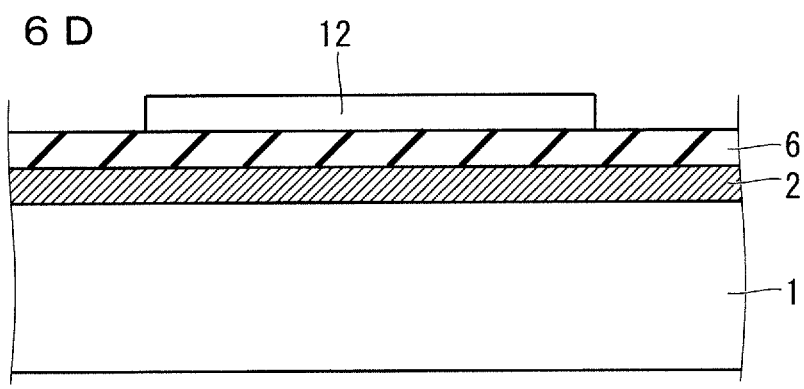
Figure 17A:
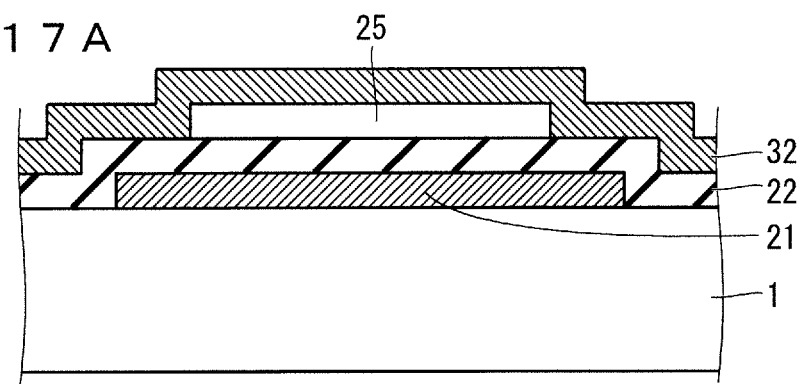
Figure 17B:
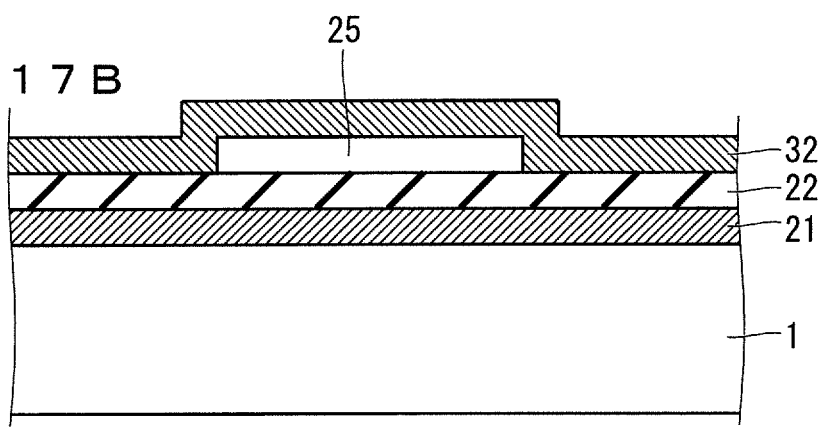
Figure 17C:
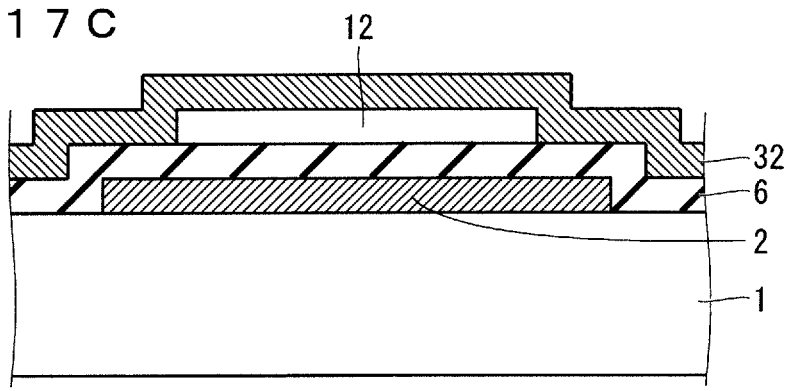
Figure 17D:
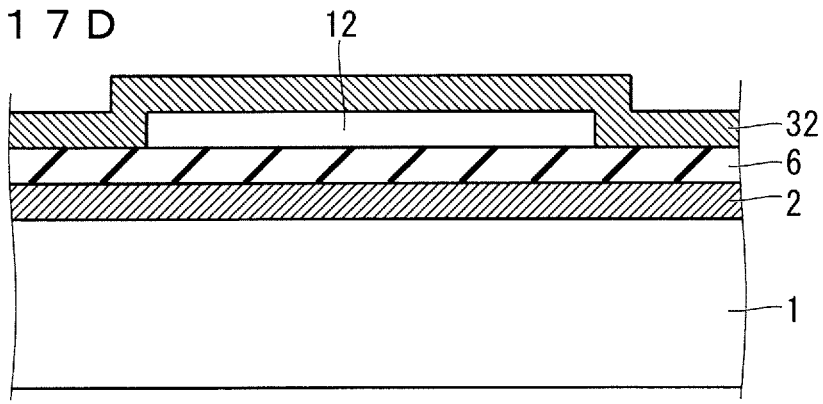

FIGS. 10 and 11 are sectional views each showing a sectional structure of the pixel TFT 201. FIG. 10 shows a sectional structure taken along line C1-C1 in FIG. 7B, and FIG. 11 shows a sectional structure taken along line D1-D1 in FIG. 7B.

As shown in FIG. 7A, FIG. 8, and FIG. 9, the drive circuit TFT 211, which is the second transistor, has the following structure.

The drive circuit TFT 211 includes the gate electrode 21, which is the second gate electrode provided on the substrate 1, the gate insulation film 22, which is the second gate insulation film covering the gate electrode 21, and the oxide semiconductor layer 25, which is the second oxide semiconductor layer provided on the gate insulation film 22. The oxide semiconductor layer 25 is provided at a position facing the gate electrode 21 via the gate insulation film 22.

The drive circuit TFT 211 further includes the source electrode 23, which is the second source electrode provided in contact with a part of the surface of the oxide semiconductor layer 25, and the drain electrode 24, which is the second drain electrode provided in contact with a part of the surface of the oxide semiconductor layer 25 and apart from the source electrode 23. The region of the oxide semiconductor layer 25 between the source electrode 23 and the drain electrode 24 becomes the second channel region, and this second channel region is defined as the channel portion 26.

The drive circuit TFT 211 further includes the protective insulation film 27, which is the second protective insulation film covering the oxide semiconductor layer 25, the source electrode 23, and the drain electrode 24.

The oxide semiconductor layer 25 of the drive circuit TFT 211 has the second structure formed without protruding outward in a channel width direction of the channel portion 26 from the source electrode 23 and the drain electrode 24.

That is, as shown in FIG. 7A, the oxide semiconductor layer 25 of the drive circuit TFT 211 is partially covered over the entire channel width direction along the X direction by the source electrode 23 and the drain electrode 24.

As shown in FIGS. 7B, 10, and 11, the pixel TFT 201, which is the first transistor, has the following structure.

The pixel TFT 201 includes the gate electrode 2, which is the first gate electrode provided on the substrate 1, the gate insulation film 6, which is the first gate insulation film provided to cover the gate electrode 2, and the oxide semiconductor layer 12, which is the first oxide semiconductor layer provided on the gate insulation film 6. The oxide semiconductor layer 12 of the pixel TFT 201 is provided at a position facing the gate electrode 2 via the gate insulation film 6.

The pixel TFT 201 further includes the source electrode 7, which is the first source electrode provided in contact with a part of the surface of the oxide semiconductor layer 12, and the drain electrode 8, which is the first drain electrode provided in contact with a part of the surface of the oxide semiconductor layer 12 and apart from the source electrode 7. The region of the oxide semiconductor layer 12 between the source electrode 7 and the drain electrode 8 of the pixel TFT 201 becomes the first channel region, and this first channel region is defined as the channel portion 13.

The pixel TFT 201 further includes the protective insulation film 14, which is the first protective insulation film provided to cover the oxide semiconductor layer 12, the source electrode 7, and the drain electrode 8.

The oxide semiconductor layer 12 of the pixel TFT 201 has the first structure having, at both end portions of each of the source electrode 7 and the drain electrode 8, a reduction action region 12X that is formed by the oxide semiconductor layer 12 protruding outward in the channel width direction along the X direction in the channel portion 13 from both the source electrode 7 and the drain electrode 8.

Hereinafter, the reduction action region 12X formed outside in the channel width direction of the source electrode 7 is referred to as a "source-side reduction action region", and the reduction action region 12X formed outside in the channel width direction of the drain electrode 8 is referred to as a "drain-side reduction action region".

In the pixel TFT 201 of the first preferred embodiment, the protective insulation film 14, which is the first protective insulation film, contains a reductant so as to function as a reduction promotion layer, and is directly formed on the surface of two types of the reduction action regions 12X of the oxide semiconductor layer 12. The protective insulation film 27, which is the second protective insulation film of the drive circuit TFT 211, also contains a reductant, and thus functions as a reduction promotion layer.

As shown in FIGS. 7B and 11, the oxide semiconductor layer 12 of the pixel TFT 201 has the first structure that protrudes outward in the channel width direction from both the source electrode 7 and the drain electrode 8 and has the two types of reduction action regions 12X, that is, the source-side reduction action region and the drain-side reduction action region.

Note that the first structure, which has one reduction action region of the source-side reduction action region and the drain-side reduction action region, has a requirement of having at least one type of reduction action region.

Therefore, in the first structure, the oxide semiconductor layer 12 may have at least one type of reduction action region 12X in which a part of the oxide semiconductor layer 12 protrudes outward in the channel width direction of the channel portion 13 from at least one electrode of the source electrode 7 and the drain electrode 8.

Hereinafter, the carrier concentration of the oxide semiconductor will be described with the pixel TFT 201 as an example.

In general, the carrier concentration of the oxide semiconductor changes under the influence of oxidation and reduction which the oxide semiconductor has at the time of formation of the pixel TFT 201, which is an oxide TFT, and when reduced, the threshold voltage decreases due to an increase in the carrier concentration, and when oxidized, the threshold voltage increases due to a decrease in the carrier concentration.

Since a portion of the oxide semiconductor layer 12 whose surface is covered with the source electrode 7 and the drain electrode 8 is protected by the source electrode 7 and the drain electrode 8, it is less likely to be affected by oxidation/reduction, so that the carrier concentration hardly changes.

On the other hand, when a portion not covered by the source electrode 7 and the drain electrode 8, that is, an exposed surface exists in the oxide semiconductor layer 12, the carrier concentration easily changes because it is easily affected by oxidation/reduction through the exposed surface. That is, the larger the area of the exposed surface of the oxide semiconductor layer 12 is, the greater the change in the carrier concentration due to the influence of oxidation/reduction becomes, and the greater the change in the threshold voltage becomes.

In the TFT substrate 200 according to the first preferred embodiment, as a method of changing the carrier concentration of the oxide semiconductor layer 12, reduction by hydrogen that diffuses from the protective insulation film 14, which constitutes the pixel TFT 201 and functions as a reduction promotion layer, to the oxide semiconductor layer 12 is used. That is, the protective insulation film 14 contains hydrogen as a reductant.

Generally, the protective insulation film 14 used in the oxide TFT is a silicon oxide ($SiO_2$) film, a silicon nitride (SiN) film, or a laminated film thereof, formed by a CVD method, and since the protective insulation film 14 is formed of silane gas ($SiH_4$) as a material, hydrogen ($H_2$) is contained in the formed protective insulation film 14. By diffusing this hydrogen as a reductant into the oxide semiconductor layer 12, the oxide semiconductor layer 12 can be reduced.

With reference to FIGS. 7A and 7B to 11, the protective insulation film 27 of the drive circuit TFT 211 is provided directly on the exposed surface of the oxide semiconductor layer 25 that is not covered with the source electrode 23 and the drain electrode 24. Similarly, the protective insulation film 14 of the pixel TFT 201 is provided directly on the exposed surface of the oxide semiconductor layer 12 that is not covered with the source electrode 7 and the drain electrode 8.

Diffusion of hydrogen occurs from the protective insulation film 27 via the exposed surface of the oxide semiconductor layer 25 in contact with the protective insulation film 27. Similarly, diffusion of hydrogen occurs from the protective insulation film 14 via the exposed surface of the oxide semiconductor layer 12 in contact with the protective insulation film 14.

As a result, the exposed surfaces of the oxide semiconductor layers 12 and 25 have a higher carrier concentration than that of the unexposed surfaces of the oxide semiconductor layers 12 and 25 by the amount of reduction.

That is, a comparison is made between the first structure, in which the two types of reduction action regions 12X protrude outward in the channel width direction from both the source electrode 7 and the drain electrode 8 as in the pixel TFT 201 shown in FIG. 7B, and the second structure, in which the oxide semiconductor layer 25 is partially covered over the entire channel width direction by the source electrode 23 and the drain electrode 24 as in the drive circuit TFT 211 shown in FIG. 7A.

In this case, since the pixel TFT 201 having the first structure has an extra reduction action region 12X, the area in contact with the protective insulation film 14 becomes larger, so that the area to be reduced becomes larger.

As a result, since the carrier concentration of the oxide semiconductor layer 12 of the pixel TFT 201 is higher than the carrier concentration of the oxide semiconductor layer 25 of the drive circuit TFT 211, the threshold voltage of the pixel TFT 201 is reliably lower than the threshold voltage of the drive circuit TFT 211.

Accordingly, even when the drive circuit TFT 211 and the pixel TFT 201 are formed on the same substrate under the formation condition that the threshold voltage of the drive circuit TFT 211 becomes positive, the threshold voltage of the pixel TFT 201 can be selectively made negative.

As described above, the pixel TFT 201, which is the first transistor of the pixel portion in the TFT substrate 200 according to the first preferred embodiment, has the first structure having the two types of reduction action regions 12X including the source-side reduction action region and the drain-side reduction action region, in which a part of the oxide semiconductor layer 12 protrudes outward in the channel width direction of the channel portion 13 from both the source electrode 7 and the drain electrode 8.

Since the pixel TFT 201 has the above-described first structure, the pixel TFT 201 is set to the first threshold voltage at which the threshold voltage is lowered by the amount of reduction action given from the protective insulation film 14 via the two types of reduction action regions 12X of the oxide semiconductor layer 12 at the time of forming the protective insulation film 14 and in the manufacturing stage after the formation of the protective insulation film 14.

In the first structure, the oxide semiconductor layer 12 may have at least one type of reduction action region 12X in which a part of the oxide semiconductor layer 12 protrudes outward the channel width direction of the channel portion 13 from at least one electrode of the source electrode 7 and the drain electrode 8. That is, if at least one of the source-side reduction action region and the drain-side reduction action region is provided, the threshold voltage can be set to the first threshold voltage at which the threshold voltage is lowered.

However, as in the pixel TFT 201 of the first preferred embodiment, the first threshold voltage can be lowered more when the first structure, which has the two types of reduction action regions 12X including the source-side reduction action region and the drain-side reduction action region, is provided.

On the other hand, the oxide semiconductor layer 25 of the drive circuit TFT 211, which is the second transistor for the scanning signal drive circuit 205, has the second structure formed without protruding outward in the channel width direction of the channel portion 26 from the source electrode 23 and the drain electrode 24.

The drive circuit TFT 211 has the second structure, and the oxide semiconductor layer 25 has no region protruding from the source electrode 23 and the drain electrode 24 in the channel width direction, that is, has no region corresponding to the reduction action region 12X of the pixel TFT 201. Hence, the second threshold voltage higher than the first threshold voltage of the pixel TFT 201 can be set as the threshold voltage of the drive circuit TFT 211 because the reduction action is not given from the protective insulation film 27 via the region corresponding to the reduction action region 12X.

As a result, in the TFT substrate 200 according to the first preferred embodiment, the pixel portion and the drive circuit can be formed on the same substrate 1 so that the threshold voltage of the pixel TFT 201 is lower than the threshold voltage of the drive circuit TFT 211.

The pixel portion means a region corresponding to the regions R3 to R7 shown in FIGS. 3 and 4, and the drive circuit corresponds to the scanning signal drive circuit 205 and the display signal drive circuit 206 shown in FIG. 2.

In the first preferred embodiment, the first threshold voltage of the pixel TFT 201 that is lower than the second threshold voltage of the drive circuit TFT 211 can be realized because the pixel TFT 201 is subjected to reduction action from the protective insulation film 14 having therein hydrogen, which is a reductant, via the two types of reduction action regions 12X of the oxide semiconductor layer 12 in the pixel TFT 211 at the time of formation of the protective insulation film 14 and in the manufacturing stage after the formation of the protective insulation film 14.

(Method for Manufacturing of First Preferred Embodiment)

FIGS. 12A to 12D to FIGS. 19A to 19D are sectional views each showing a method for manufacturing the TFT substrate 200 according to the first preferred embodiment. FIGS. 12A to 19A each show the region corresponding to the A1-A1 section of FIG. 7A, FIGS. 12B to 19B each show the region corresponding to the B1-B1 section of FIG. 7A, FIGS. 12C to 19C each show the region corresponding to the C1-C1 section of FIG. 7B, and FIGS. 12D to 19D each show the region corresponding to the D1-D1 section of FIG. 7B.

Hereinafter, a method for manufacturing the TFT substrate 200 according to the first preferred embodiment will be described with reference to FIGS. 12A to 12D to FIGS. 19A to 19D, focusing on the manufacturing processes of the pixel TFT 201 and the drive circuit TFT 211.

First, the substrate 1, which is a transparent insulation substrate such as glass, is cleaned with a cleaning liquid or pure water. In the first preferred embodiment, an alkali-free glass substrate having a thickness of 0.5 mm is used as the substrate 1.

Next, as shown in FIGS. 12A to 12D, a first conductive film 31 is formed on the cleaned substrate 1.

Thereafter, as shown in FIGS. 13A to 13D, the first conductive film 31 is patterned to selectively form the gate electrode 21 and the gate electrode 2 on the substrate 1.

Here, as the first conductive film 31, for example, Al, Cr, Cu, Mo, an alloy in which another element is added to these elements in a small amount, or the like can be used. Alternatively, a laminated film on which two or more layers of these metals and alloys are formed may be used as the first conductive film 31. By using these metals and alloys, a low resistance film having a specific resistance value of 50 µΩcm or less can be obtained. The conductivity of the low resistance film may be, for example, $2 \times 10^4$ S/cm or more.

In the first preferred embodiment, an Mo film is used as the first conductive film 31, and the Mo film is formed to a thickness of 200 nm by a sputtering method using a publicly known Ar gas. Thereafter, a resist material is applied on the Mo film, and the applied resist material is exposed to light using a photo mask. Next, the exposed resist material is developed, and the resist material is patterned to obtain a photoresist pattern. Hereinafter, a series of processes for forming a photoresist pattern is referred to as a photolithography.

Using the photoresist pattern (not shown) obtained in this photolithography as an etching mask, the Mo film is selectively etched and patterned. Thereafter, the photoresist pattern is removed to selectively form the gate electrode 21 and the gate electrode 2 on the substrate 1, as shown in FIGS. 13A to 13D.

In this etching, wet etching with a solution containing publicly known phosphoric acid, nitric acid, and acetic acid can be used. Hereinafter, the above-mentioned solution is referred to as "PAN solution".

The PAN solution preferably has ranges of 40 to 93 wt % (weight %) of phosphoric acid, 1 to 40 wt % of acetic acid, and 0.5 to 15 wt % of nitric acid. Note that in the first preferred embodiment, a PAN solution containing 70 wt % of phosphoric acid, 7 wt % of acetic acid, 5 wt % of nitric acid, and water is used, and the Mo film is etched at a liquid temperature of 25° C.

Next, as shown in FIGS. 14A to 14D, the gate insulation film 22 and the gate insulation film 6, which are the second and first gate insulation films, are formed on the substrate 1, and the gate electrode 21 and the gate electrode 2 are covered with the insulation film 22 and the gate insulation film 6. The gate insulation film 22 and the gate insulation film 6 are the same thing produced by the same process. In this description, reference numerals are assigned to the gate insulation film 22 and the gate insulation film 6 in order to distinguish between the drive circuit TFT 211 and the pixel TFT 201.

For the gate insulation film 22 and the gate insulation film 6, for example, a silicon oxide (SiO) film formed by using a chemical vapor deposition (CVD) method is used. Here, a 300 nm-thick SiO film is formed as the gate insulation film 22 and the gate insulation film 6 by using a silane ($SiH_4$) gas and a dinitrogen monoxide ($N_2O$) gas under a substrate heating condition of 150 to 400° C.

However, the gate insulation film 22 and the gate insulation film 6 are not limited thereto. For example, the SiO film has a low barrier property, that is, a low interruption property, with respect to impurity elements that affect TFT characteristics, such as water ($H_2O$), hydrogen ($H_2$), sodium (Na), and potassium (K).

For this reason, a laminated film may be formed by providing a silicon nitride (SiN) film or the like having an excellent barrier property under the SiO film. The SiN film can be formed by the CVD method using, for example, $SiH_4$ gas, ammonia ($NH_3$) gas, and nitrogen ($N_2$) gas. In this case, the thicknesses of the laminated films of the SiO film and the SiN film may be adjusted to be, for example, 100 to 500 nm.

Next, as shown in FIGS. 15A to 15D, the oxide semiconductor layer 25 and the oxide semiconductor layer 12 are formed on the entire surfaces of the gate insulation film 22 and the gate insulation film 6. The oxide semiconductor layer 25 and the oxide semiconductor layer 12 are the same thing produced by the same process. In this description, reference numerals are assigned to the oxide semiconductor layer 25 and the oxide semiconductor layer 12 in order to distinguish between the drive circuit TFT 211 and the pixel TFT 201.

The oxide semiconductor layer 25 and the oxide semiconductor layer 12 are formed by a physical vapor deposition method such as a sputtering method, a vapor deposition method, and an ion plating method. In these formation methods, plasma or arc discharge is emitted to a target material placed in a film formation chamber such as a reaction chamber, and a material ejected from the target material by the impact is deposited on the substrate 1. In this case, a gas that is necessary for discharge is introduced into the film formation chamber in addition to the target material. As a necessary gas, for example, argon gas is considered. Furthermore, in order to change the composition of the film to be deposited on the substrate 1, for example, a gas such as oxygen or nitrogen can also be introduced.

As described above, according to the physical vapor deposition method such as the sputtering method, the vapor deposition method, and the ion plating method, thin films having various characteristics can be formed as the oxide semiconductor layers 25 and 12 by a combination of the target material placed in the film formation chamber and the gas to be introduced.

The formation method of the oxide semiconductor layers 25 and 12 will be described in more detail. After the substrate 1 is disposed in the film formation chamber, the pressure in the film formation chamber is reduced. Thereafter, the oxide semiconductor layers 25 and 12 are formed in the film formation chamber by the physical vapor deposition method using a metal oxide as a target material. As the target material, for example, an InGaZnO target $[In_2O_3 \cdot Ga_2O_3 \cdot (ZnO)_2]$ having an atomic composition ratio of In:Ga:Zn:O of 1:1:1:4 is used, and as the physical vapor deposition method, for example, the sputtering method is used.

If an oxide target is sputtered by a sputtering method using publicly known Ar gas or Kr gas, an oxide semiconductor layer in a state where the atomic composition ratio of oxygen is smaller than the stoichiometric composition and oxygen ions are depleted is formed. Specifically, in the example of $[In_2O_3 \cdot Ga_2O_3 \cdot (ZnO)_2]$, the composition ratio of O is less than 4. Therefore, it is desirable to perform sputtering by mixing oxygen (O2) gas with Ar gas. In the first preferred embodiment, sputtering is performed using a mixed gas in which $O_2$ gas at a partial pressure ratio of 10% to Ar gas is added to form the oxide semiconductor layers 25 and 12 having a thickness of 40 nm.

After the oxide semiconductor layers 25 and 12 are formed on the gate insulation films 22 and 6, a resist material (not shown) is applied on the oxide semiconductor layers 25 and 12, a photoresist pattern is formed in a photolithography, and the oxide semiconductor layers 25 and 12 are selectively etched using the photoresist pattern as an etching mask and patterned, thereby selectively forming the oxide semiconductor layers 25 and 12.

Thereafter, by removing the photoresist pattern, as shown in FIGS. 16A to 16D, the oxide semiconductor layer 25 and the oxide semiconductor layer 12 can be obtained above the gate electrode 21 and the gate electrode 2 via the gate insulation films 22 and 6.

In this etching, wet etching with a solution containing a publicly known carboxylic acid can be used. The solution containing the carboxylic acid preferably contains oxalic acid in the range of 1 to 10 wt %. In the first preferred embodiment, the oxide semiconductor layers 25 and 12 are patterned using an oxalic acid solution containing 5 wt % of oxalic acid and water and setting the liquid temperature at 25° C.

As shown in FIGS. 7A and 7B, the oxide semiconductor layers 25 and 12 are patterned such that the edge portions of the oxide semiconductor layers 25 and 12 do not protrude outside the edge portions of the gate electrodes 21 and 2 in plan view, and the oxide semiconductor layers 25 and 12 are entirely contained in the formation region of the gate electrodes 21 and 2 in plan view. As a result, the oxide semiconductor layers 25 and 12 are provided at positions facing the gate electrode 21 and the gate electrode 2 via the gate insulation films 22 and 6.

As a result, in FIG. 1, in the transmissive LCD that selectively transmits and displays the light emitted from the backlight unit including the light source 1001 and the light guide plate 1002 to the back surface of the TFT substrate 1004, the pattern of the gate electrode 21 and the gate electrode 2 can serve as a light shielding mask to suppress the light from directly entering the oxide semiconductor layer 25 and the oxide semiconductor layer 12. As a result, degradation of TFT characteristics due to light emission can be suppressed.

After the etching is performed, an annealing treatment at 350° C. is performed in the atmosphere for one hour. By performing this process, the oxidation of the oxide semiconductor layers 25 and 12 is facilitated, and even when the oxide semiconductor layers 25 and 12 are reduced in the etching, the film forming processing, and the annealing treatment in the subsequent process, a predetermined carrier concentration can be obtained.

In the first preferred embodiment, the annealing treatment is carried out at 350° C. in the atmosphere for one hour, but since the oxidation state immediately after the film formation varies depending on the film formation conditions of the oxide semiconductor layers 25 and 12, the annealing treatment conditions can be changed depending on the degree of oxidation, and the annealing treatment is carried out at approximately 300° C. to 450° C. of the heat treatment temperature, for 30 minutes to two hours, and in the atmosphere or oxygen.

Next, as shown in FIGS. 17A to 17D, a second conductive film 32 is formed on the substrate 1, and the second conductive film 32 is patterned to selectively form the source electrode 23, the source electrode 7, the drain electrode 24, and the drain electrode 8 as shown in FIGS. 18A to 18D.

Figure 18A:
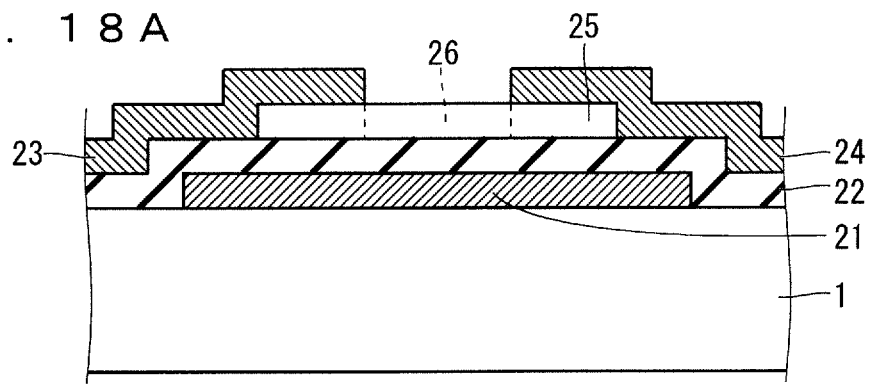
Figure 18B:
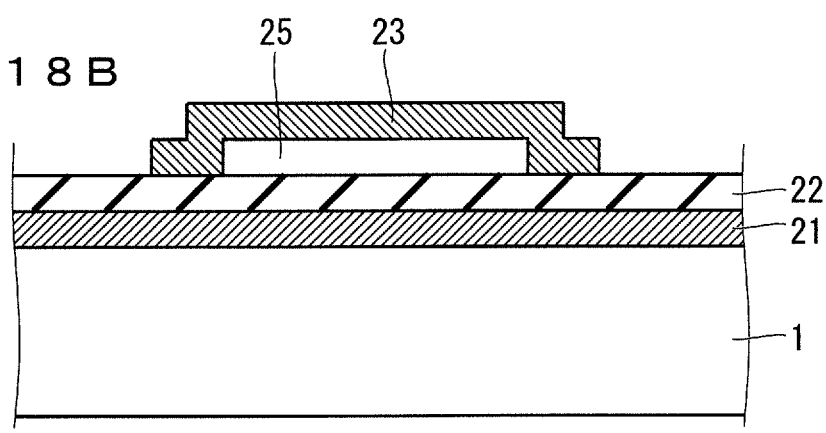
Figure 18C:
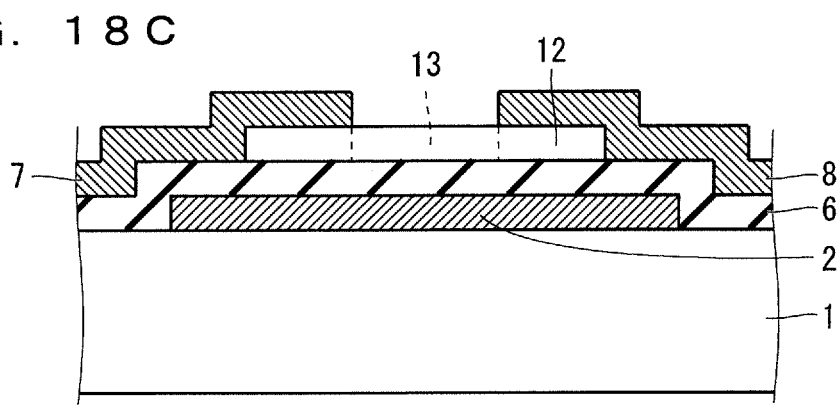

At this time, as shown in FIG. 18A, the central region in the oxide semiconductor layer 25 in which the source electrode 23 and the drain electrode 24 are not formed becomes the channel portion 26, and as shown in FIG. 18C, the central region in the oxide semiconductor layer 12 existing between the source electrode 7 and the drain electrode 8 in which the source electrode 7 and the drain electrode 8 are not formed becomes the channel portion 13.

Here, as the second conductive film 32, for example, Al, Cr, Cu, Mo, an alloy in which another element is added to these elements in a small amount, or the like can be used. Alternatively, a laminated film on which two or more layers of these metals and alloys are formed may be used as a conductive film 8A (not shown). By using these metals and alloys, a low resistance film having a specific resistance value of 50 μΩcm or less can be obtained. The conductivity of the low resistance film may be, for example, $2\times10^4$ S/cm or more.

In the first preferred embodiment, an Mo film is used as the second conductive film 32, and the Mo film is formed to a thickness of 200 nm by a sputtering method using a publicly known Ar gas. Thereafter, a resist material is applied to the Mo film, a photoresist pattern (not shown) is formed in the photolithography, and the Mo film is selectively etched using the photoresist pattern as an etching mask and patterned. As a result, the source electrode 23, the drain electrode 24, the source electrode 7, and the drain electrode 8 can be formed.

In this etching, wet etching with a publicly known PAN solution can be used. Note that in the first preferred embodiment, a PAN solution containing 70 wt % of phosphoric acid, 7 wt % of acetic acid, 5 wt % of nitric acid, and water is used, and the Mo film is etched at a liquid temperature of 25° C.

Thereafter, by removing the photoresist pattern, as shown in FIGS. 18A to 18D, the source electrode 23, the source electrode 7, the drain electrode 24, and the drain electrode 8 that are electrically connected to the oxide semiconductor layer 25 and the oxide semiconductor layer 12 are obtained.

In forming the source electrode 23 and the drain electrode 24, in the drive circuit TFT 211, as shown in FIGS. 7A and 18B, the oxide semiconductor layer 25 is partially covered over the entire channel width direction by the source electrode 23 and the drain electrode 24.

Thus, the oxide semiconductor layer 25 can have the second structure formed without protruding outward in the channel width direction of the channel portion 26 from the source electrode 23 and the drain electrode 24.

Figure 18D:
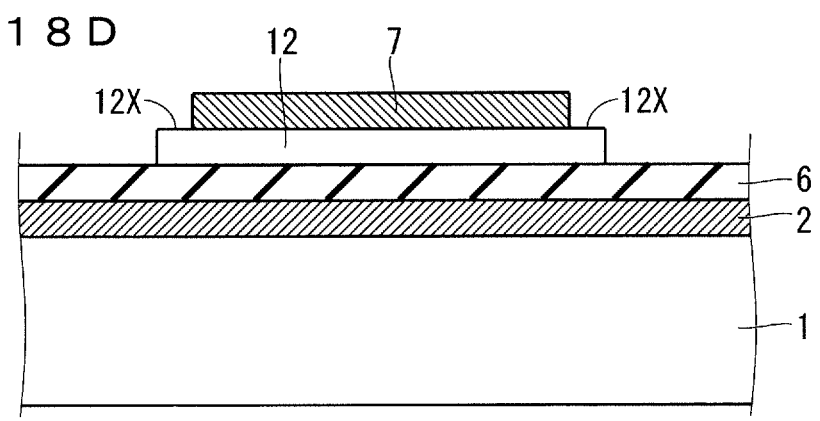
Figure 19A:
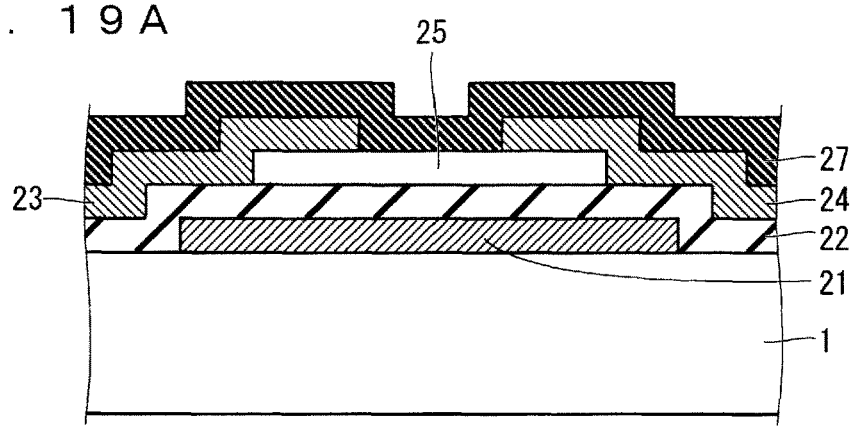
Figure 19B:
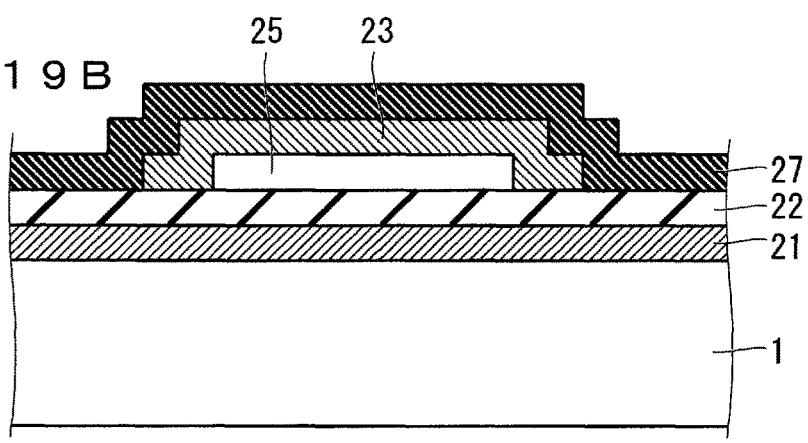
Figure 19C:
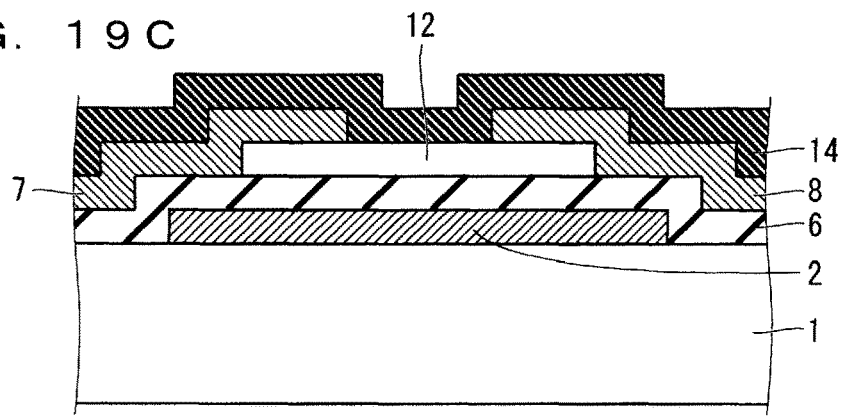
Figure 19D:
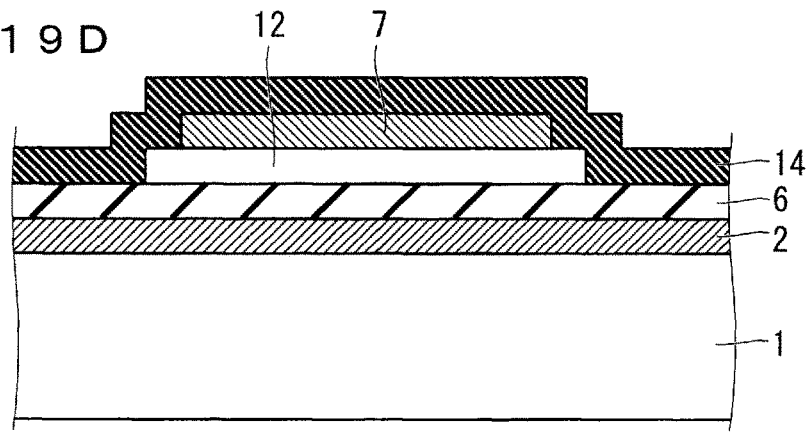

On the other hand, in forming the source electrode 7 and the drain electrode 8, in the pixel TFT 201, as shown in FIGS. 7B and 18D, the oxide semiconductor layer 12 has the first structure having the two types of reduction action regions 12X constituted with the source-side reduction action region and the drain-side reduction action region, which protrude outward in the channel width direction from both the source electrode 7 and the drain electrode 8.

As described above, if at least one type of reduction action region of the source-side reduction action region and the drain-side reduction action region exists, the requirement of the first structure is satisfied.

Next, as shown in FIGS. 19A to 19D, the protective insulation film 27 and the protective insulation film 14, which are the second and first protective insulation films, are formed so as to cover the source electrode 23, the source electrode 7, the drain electrode 24, the drain electrode 8, the channel portion 26 of the oxide semiconductor layer 25, and the channel portion 13 of the oxide semiconductor layer 12. The protective insulation film 27 and the protective insulation film 14 are the same thing produced by the same process. In this description, reference numerals are assigned to the protective insulation film 27 and the protective insulation film 14 in order to distinguish between the drive circuit TFT 211 and the pixel TFT 201.

The protective insulation films 27 and 14 are obtained by forming a 300 nm-thick SiO film using the CVD method under the condition that the substrate 1 is heated within a temperature range of 150 to 400° C., for example. The SiO film has a low barrier property, that is, a low interruption property, with respect to impurity elements that affect TFT characteristics, such as water ($H_2O$), hydrogen ($H_2$), sodium (Na), and potassium (K). For this reason, a laminated film in which a silicon nitride (SiN) film or the like having an excellent barrier property is provided under the SiO film may be used as the protective insulation film 27 and the protective insulation film 14.

The protective insulation films 27 and 14 are silicon oxide ($SiO_2$) films, silicon nitride (SiN) films, or laminated films thereof formed by the CVD method, and since the protective insulation films 27 and 14 are formed of silane gas ($SiH_4$) as a material, hydrogen ($H_2$) is contained in the formed protective insulation films 27 and 14.

This hydrogen diffuses into the oxide semiconductor layer 25 and the oxide semiconductor layer 12 from a contact portion between the protective insulation film 27 and the oxide semiconductor layer 25 and a contact portion between the protective insulation film 14 and the oxide semiconductor layer 12 during the formation of the protective insulation films 27 and 14, or during the annealing treatment or the film forming process after this process, and a part of the oxide semiconductor layer 25 and the oxide semiconductor layer 12 is reduced to increase the carrier concentration in the reduced portion.

That is, with reference to FIGS. 7A and 7B, the exposed surface of the oxide semiconductor layer 25 that is not covered with the source electrode 23 and the drain electrode 24 has a higher carrier concentration than that of the unexposed surface of the oxide semiconductor layer 25 that is covered with the source electrode 23 and the drain electrode 24 by the amount of reduction from the protective insulation film 27.

Similarly, the exposed surface of the oxide semiconductor layer 12 that is not covered with the source electrode 7 and the drain electrode 8 has a higher carrier concentration than that of the unexposed surface of the oxide semiconductor layer 12 that is covered with the source electrode 7 and the drain electrode 8 by the amount of reduction from the protective insulation film 14.

As shown in FIG. 7B, as the exposed surface of the oxide semiconductor layer 12 in the pixel TFT 201, there are two types of reduction action regions 12X protruding outward in the channel width direction from both the source electrode 7 and the drain electrode 8.

On the other hand, similarly to the drive circuit TFT 211 shown in FIG. 7A, the oxide semiconductor layer 25 is partially covered over the entire channel width direction by the source electrode 23 and the drain electrode 24, and there is no region corresponding to the reduction action region 12X.

Comparing the pixel TFT 201 with the drive circuit TFT 211, the area in contact with the oxide semiconductor layer 12 and the protective insulation film 14 is wider than the area in contact with the oxide semiconductor layer 25 and the protective insulation film 27 by an extra amount of the two types of reduction action regions 12X, so that the area to be reduced becomes wider, and the carrier concentration of the oxide semiconductor layer 12 of the pixel TFT 201 becomes higher than that of the oxide semiconductor layer 25 of the drive circuit TFT 211.

In a normal TFT formation process, although not shown, a resist material is applied on the protective insulation films 27 and 14, a photoresist pattern is formed in the photolithography, and a silicon oxide film is selectively etched using the photoresist pattern as an etching mask to form a contact hole. In this etching, a publicly known dry etching method using fluorine gas can be used.

Next, although not shown, a conductive film 11A (not shown) is formed as a third conductive film on the substrate 1, and the pixel drain contact hole 15, the gate terminal portion contact hole 16, and the source terminal portion contact hole 17 are built therein.

A transparent conductive film is formed as the conductive film 11A. As the transparent conductive film in the first preferred embodiment, an InZnO film as a publicly known conductive oxide having a mixing ratio of indium oxide ($In_2O_3$) and zinc oxide (ZnO) of 90:10 by weight % is used. Here, an InZnO film having a thickness of 100 nm is formed by a publicly known sputtering method. However, the transparent conductive film is not limited to the indium zinc oxide (IZO) film described above, and an indium tin oxide (ITO) film or the like can also be used.

Thereafter, a resist material is applied to the conductive film 11A, a photoresist pattern (not shown) is formed in the photolithography, and the conductive film 11A is selectively etched using the photoresist pattern as an etching mask and patterned. Thereafter, by removing the photoresist pattern, as shown in FIG. 4, the transmissive pixel electrode 11, the gate terminal pad 18, and the source terminal pad 19 are formed, and the TFT substrate 200 according to the first preferred embodiment is completed.

In this etching, wet etching with a publicly known oxalic acid solution can be used.

The reason of use of a transparent conductive film for the conductive film 11A is that, in a transmissive LCD for selectively transmitting and displaying light from the backlight unit, it is necessary to form a transmissive pixel electrode. On the other hand, in a reflective LCD for selectively reflecting external light for display, a metal film such as Al and silver (Ag) for reflecting light may be formed as a pixel electrode. In the case of a semi-transmissive LCD having both reflective and transmissive characteristics, a pixel electrode having both light reflective characteristics and light transmissive characteristics may be formed.

In the TFT substrate 200 according to the first preferred embodiment thus formed, the carrier concentration of the oxide semiconductor layer 25 of the drive circuit TFT 211 is in the range of $1\times10^{11}$ to $1\times10^{14}/cm^3$, and the carrier concentration of the oxide semiconductor layer 12 of the pixel TFT 201 is in the range of $1\times10^{12}$ to $1\times10^{16}/cm^3$. As a result, the drive circuit TFT 211 can be manufactured such that the second threshold voltage becomes positive and the pixel TFT 201 can be manufactured such that the first threshold voltage becomes negative.

Thus, in the method for manufacturing the TFT substrate 200, the oxide semiconductor layer formation process for forming the oxide semiconductor layers 25 and 12 shown in FIGS. 15A to 15D and FIGS. 16A to 16D and the electrode formation process for forming the source electrode 23, the source electrode 7, the drain electrode 24, and the drain electrode 8 shown in FIGS. 17A to 17D and FIGS. 18A to 18D are performed so as to satisfy the following conditions (1) and (2).

Condition (1): The oxide semiconductor layer 12, which is the first oxide semiconductor layer, has the first structure having the two types of reduction action regions 12X constituted with the source-side reduction action region and the drain-side reduction action region.

Condition (2): The oxide semiconductor layer 25, which is the second oxide semiconductor layer, has the second structure having no region corresponding to the reduction action region 12X. That is, the oxide semiconductor layer 25 has the second structure having neither the source-side reduction action region nor the drain-side reduction action region.

As a result, in the method for manufacturing the TFT substrate 200 according to the first preferred embodiment, the pixel TFT 201 and the drive circuit TFT 211 can be formed on the same substrate 1 by performing the oxide semiconductor layer formation process and the electrode formation process that are common between the pixel TFT 201 and the drive circuit TFT 211 such that the first threshold voltage of the pixel TFT 201 becomes lower than the second threshold voltage of the drive circuit TFT 211.

Specifically, in the protective insulation film formation process for forming the protective insulation films 27 and 14 shown in FIGS. 19A to 19D and in the subsequent manufacturing process, the first threshold voltage that is lower than the second threshold voltage can be set because the two types of reduction action regions 12X of the oxide semiconductor layer 12 of the pixel TFT 201 are additionally subjected to reduction action from the protective insulation film 14 having therein hydrogen as a reductant.

In particular, since the pixel TFT 201 of the first preferred embodiment has the first structure having the two types of reduction action regions 12X composed of the source-side reduction action region and the drain-side reduction action region, the first threshold voltage can be lowered as compared to a case where only one of the source-side reduction action region and the drain-side reduction action region is formed.

In the first preferred embodiment, the carrier concentrations of the drive circuit TFTs 211 and the pixel TFTs 201 are adjusted by a reduction action due to the diffusion of hydrogen during the formation of the protective insulation films 27 and 14, but the diffusion of hydrogen may be promoted by the film forming process after the formation of the protective insulation films 27 and 14 or an annealing treatment, in addition to the film forming process of the protective insulation films 27 and 14.

The completed TFT substrate 200 corresponds to the TFT substrate 1004 shown in FIG. 1, and an alignment film and a spacer (not shown) are formed on the surface thereof. The alignment film is a film for aligning liquid crystal molecules and is composed of polyimide or the like. The counter substrate 1006 shown in FIG. 1 having a color filter and an alignment film is prepared, and the TFT substrate 1004 and the counter substrate 1006 are bonded to each other. Then, the liquid crystal is injected and held into the gap formed between the two substrates by the spacer.

Thereafter, the polarizing plates 1003 and 1007 are disposed on the outside of both substrates, the backlight unit including the light source 1001 and the light guide plate 1002 is disposed on further outside of the TFT substrate 1004, and a retardation plate is disposed on further outside of the counter substrate 1006. Thus, the liquid crystal display 1000 having the configuration shown in FIG. 1 can be obtained by using the TFT substrate 200 according to the first preferred embodiment as the TFT substrate 1004.

The TFT substrate 200 according to the first preferred embodiment described above may be used in a display apparatus other than a liquid crystal display. For example, the present invention can be applied to an electro-optical display apparatus such as an organic electro luminescence (EL) display. The pixel TFT 201 may be used as a thin film transistor used in a semiconductor device other than the electro-optical display apparatus or as a thin film transistor of an active matrix substrate other than the electro-optical display apparatus.

Second Preferred Embodiment (Configuration of Second Preferred Embodiment)

In a second preferred embodiment, a case of use of an etching stopper type TFT is shown.

Figure 20A:
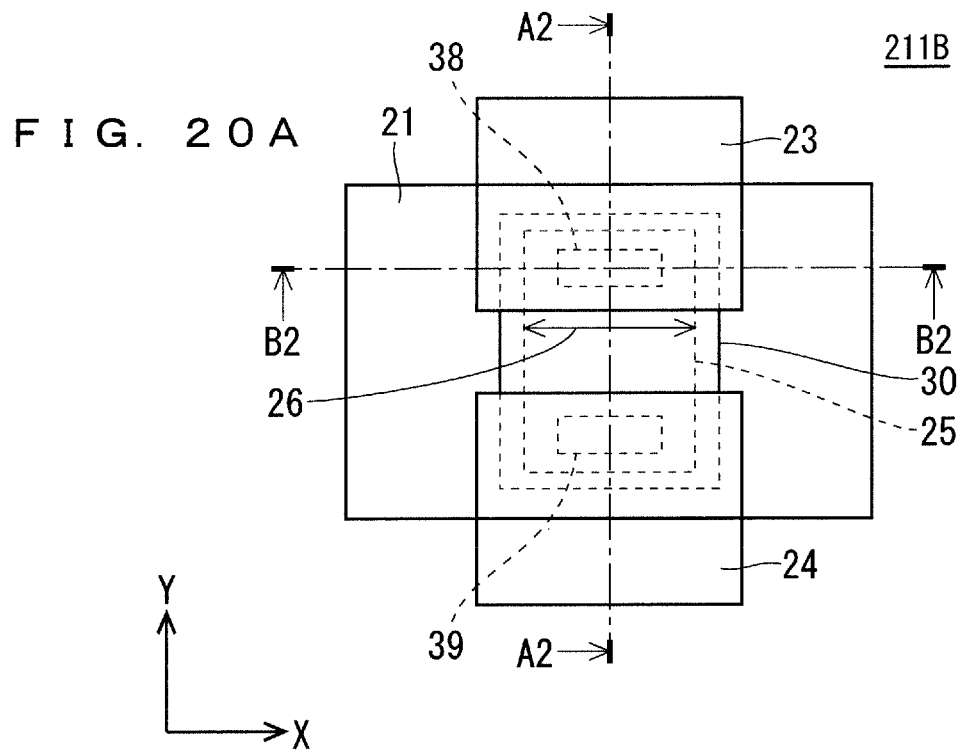
FIGS. 20A and 20B are plan views each showing a planar structure of a pixel TFT and a drive circuit TFT according to a second preferred embodiment.
Figure 20B:
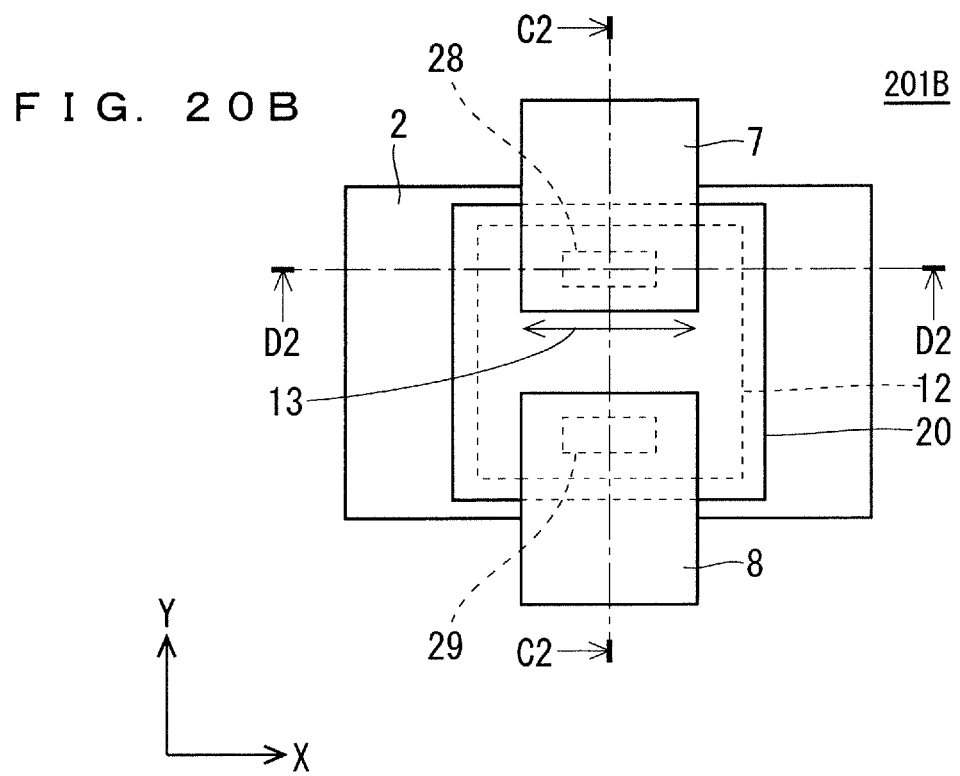

FIGS. 20A and 20B are plan views each showing a planar structure of a pixel TFT 201B, which is the first transistor of the second preferred embodiment, and a drive circuit TFT 211B, which is the second transistor. FIG. 20A is a plan view of the drive circuit TFT 211B, and FIG. 20B is a plan view of the pixel TFT 201B. FIGS. 20A and 20B each show an XY rectangular coordinate system. FIG. 20A does not illustrate the protective insulation film 27, and FIG. 20B does not illustrate the protective insulation film 14.

Figure 21:
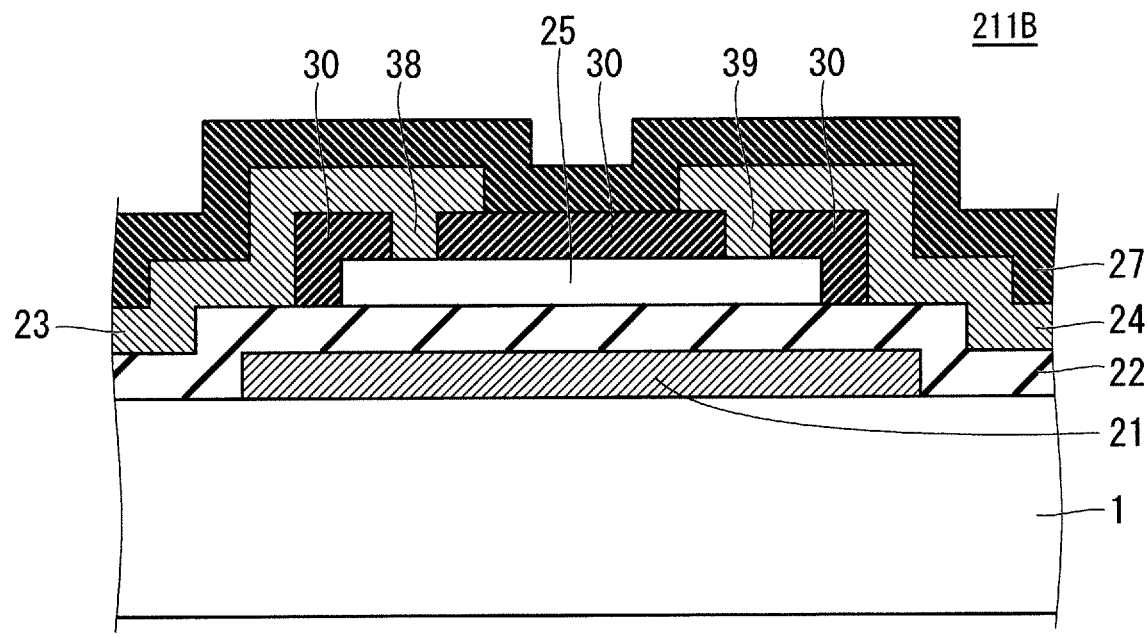
FIG. 21 is a sectional view (part 1) showing a sectional structure of the drive circuit TFT shown in FIGS. 20A and 20B.
Figure 22:
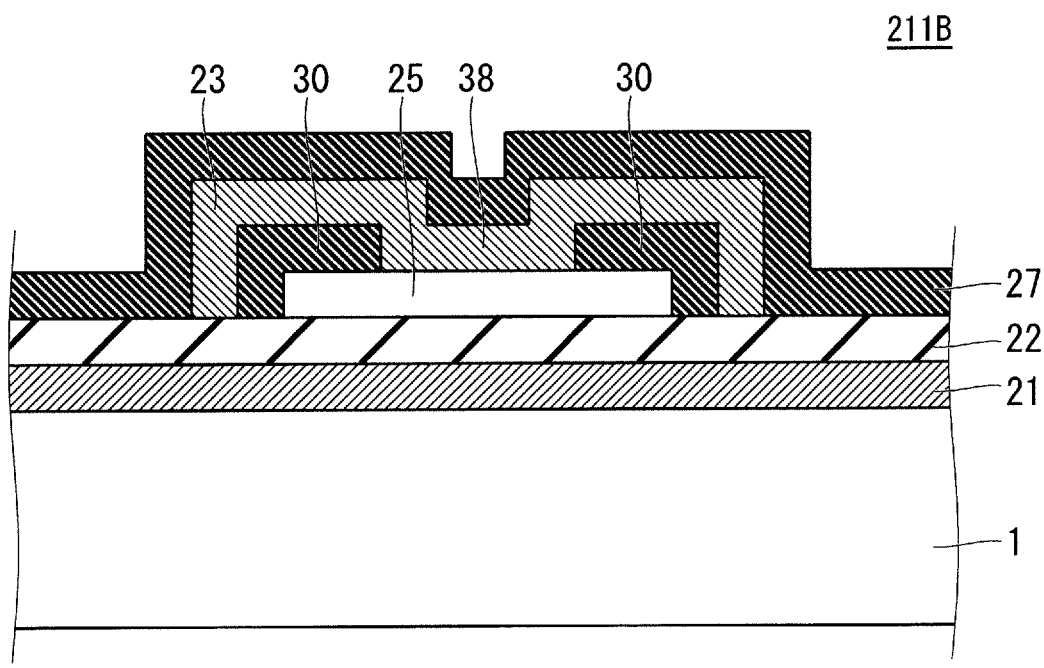
FIG. 22 is a sectional view (part 2) showing a sectional structure of the drive circuit TFT shown in FIGS. 20A and 20B.

FIGS. 21 and 22 are sectional views each showing a sectional structure of the drive circuit TFT 211B. FIG. 21 shows a sectional structure taken along line A2-A2 in FIG. 20A, and FIG. 22 shows a sectional structure taken along line B2-B2 in FIG. 20A.

Figure 23:
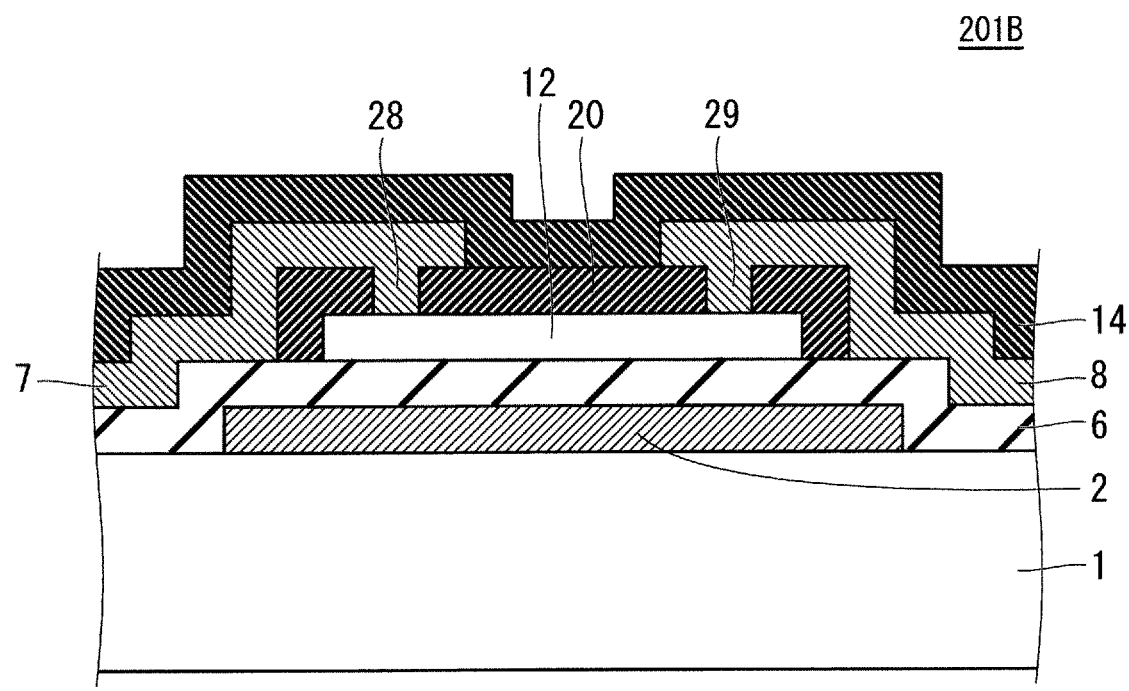
FIG. 23 is a sectional view (part 1) showing a sectional structure of the pixel TFT shown in FIGS. 20A and 20B.
Figure 24:
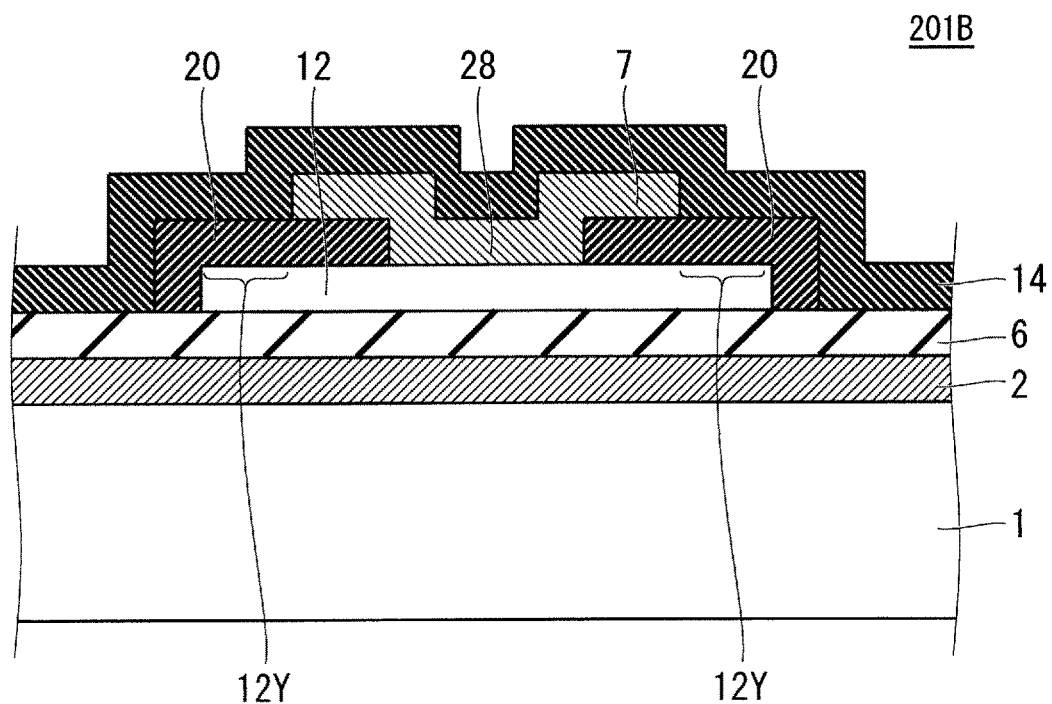
FIG. 24 is a sectional view (part 2) showing a sectional structure of the pixel TFT shown in FIGS. 20A and 20B.
Figure 25A:
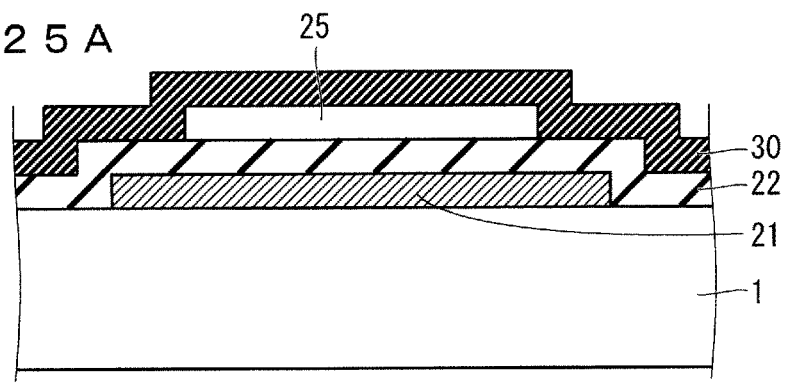
Figure 25B:
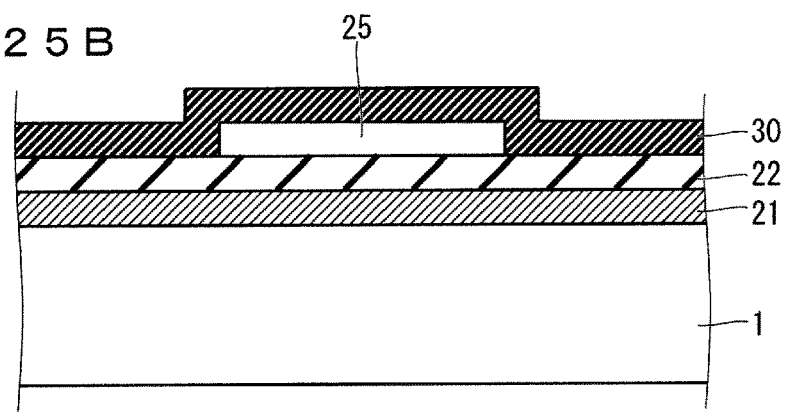
Figure 25C:
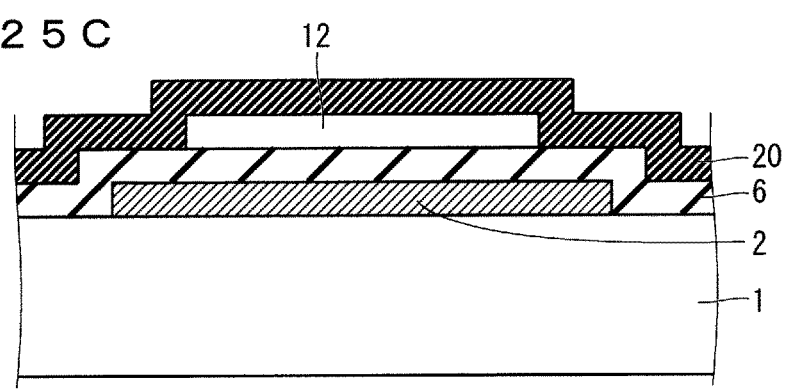
Figure 25D:
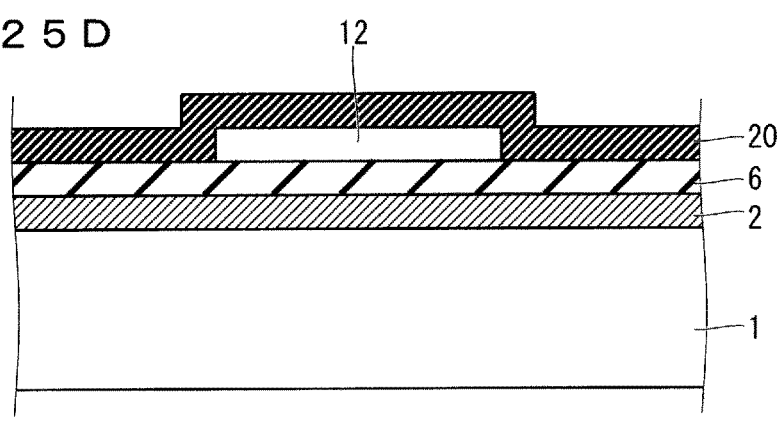
Figure 26A:
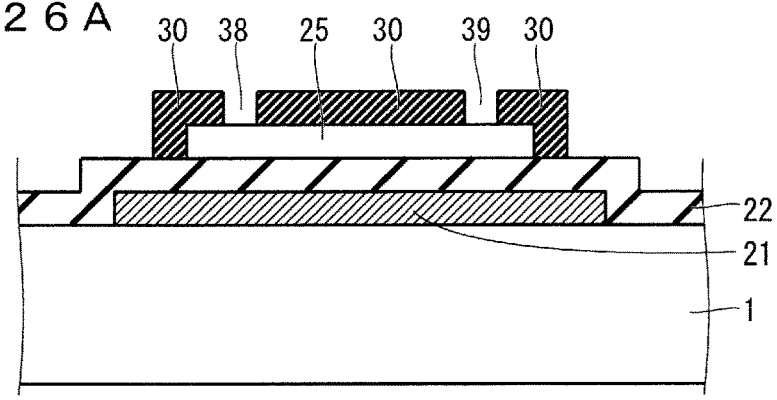
Figure 26B:
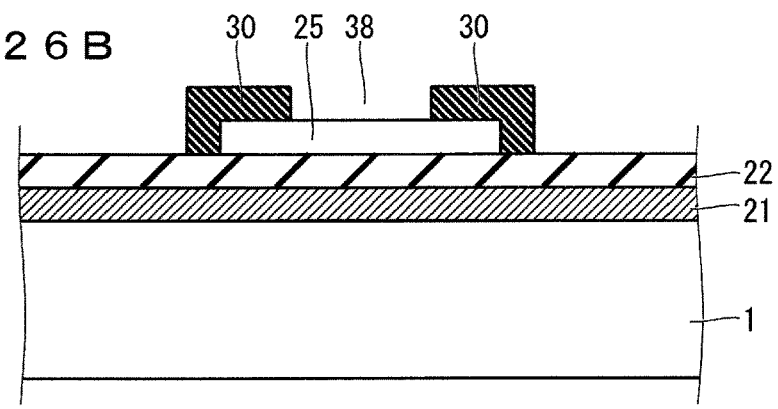
Figure 26C:
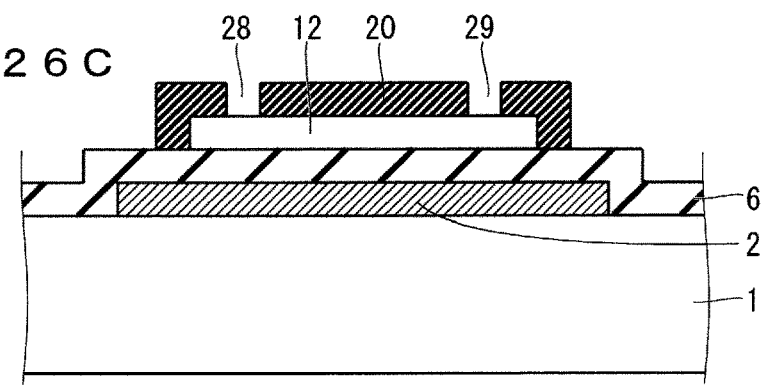
Figure 26D:
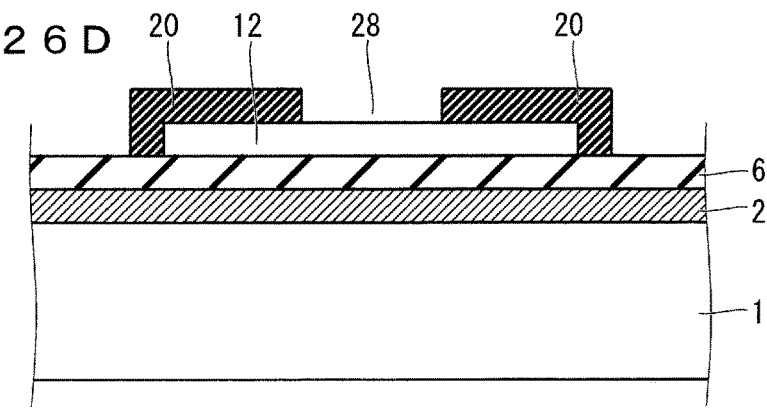
Figure 27A:
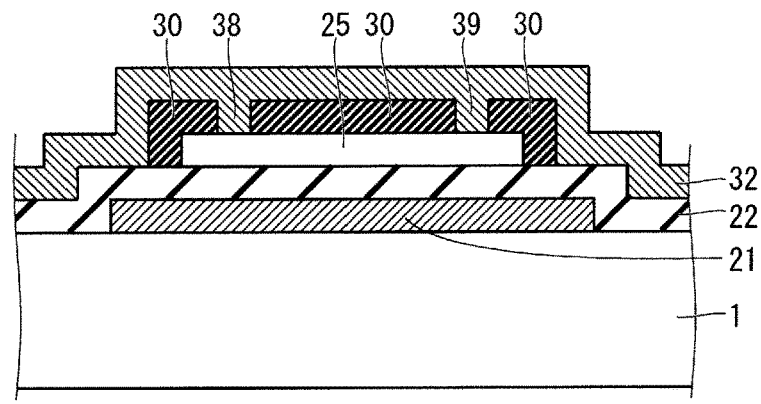
Figure 27B:
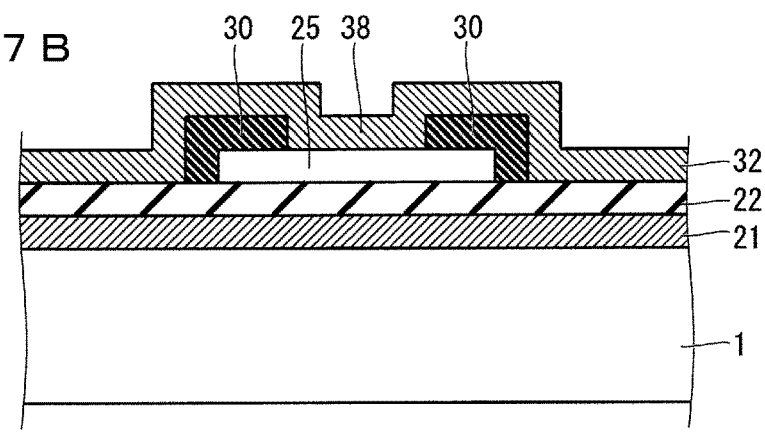
Figure 27C:
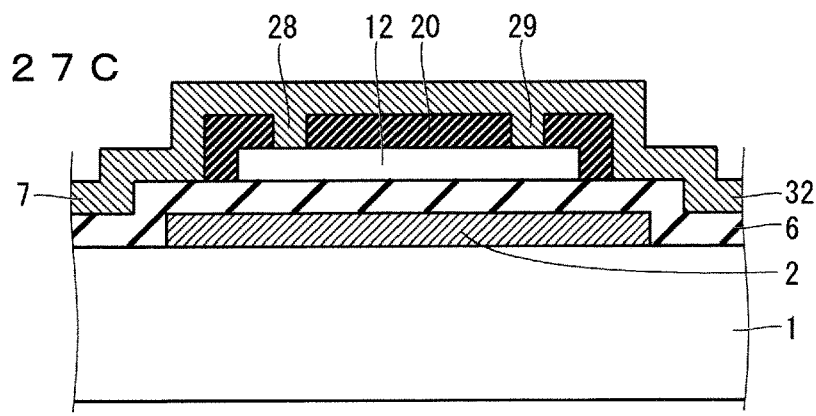
Figure 27D:
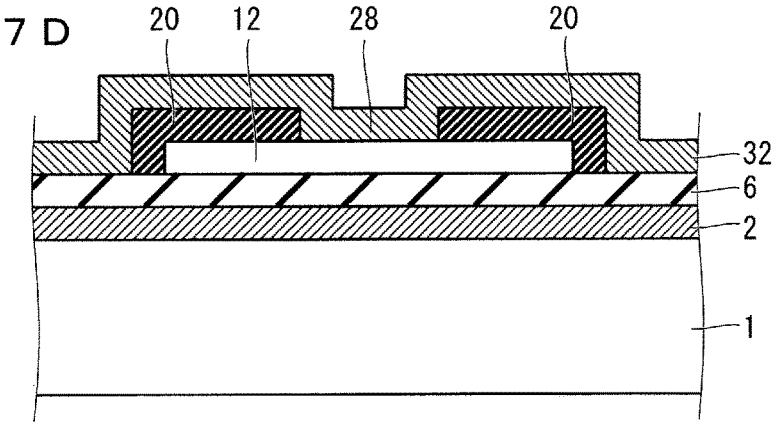

FIGS. 23 and 24 are sectional views each showing a sectional structure of the pixel TFT 201B. FIG. 23 shows a sectional structure taken along line C2-C2 in FIG. 20B, and FIG. 24 shows a sectional structure taken along line D2-D2 in FIG. 20B.

As shown in FIG. 20A, FIG. 21, and FIG. 22, the drive circuit TFT 211B, which is the second transistor, has the following structure. In the following, description of the same structural portions as those of the drive circuit TFT 211 of the first preferred embodiment will be omitted as appropriate, and features unique to the drive circuit TFT 211B will be described.

The drive circuit TFT 211B as the second transistor further includes an etching stopper layer 30, which is a second auxiliary insulation film covering the oxide semiconductor layer 25, which is the second oxide semiconductor layer. The etching stopper layer 30 has a reductant therein.

In order to make contact between the source electrode 23 and the oxide semiconductor layer 25, a source contact hole 38 is formed through a part of the etching stopper layer 30. In order to make contact between the drain electrode 24 and the oxide semiconductor layer 25, a drain contact hole 39 is formed through a part of the etching stopper layer 30.

Therefore, the source electrode 23 can make contact with the exposed surface of the oxide semiconductor layer 25 via the source contact hole 38, and the drain electrode 24 can make contact with the exposed surface of the oxide semiconductor layer 25 via the drain contact hole 39.

The protective insulation film 27 is provided to cover the etching stopper layer 30, in addition to the oxide semiconductor layer 25, the source electrode 23, and the drain electrode 24.

In the second structure of the drive circuit TFT 211B, the oxide semiconductor layer 25 and the etching stopper layer 30 are formed without protruding outward in the channel width direction of the channel portion 26 from the source electrode 23 and the drain electrode 24.

As shown in FIGS. 20B, 23, and 24, the pixel TFT 201B, which is the first transistor, has the following structure. In the following, description of the same structural portions as those of the pixel TFT 201B of the first preferred embodiment will be omitted as appropriate, and features unique to the pixel TFT 201B will be described.

The pixel TFT 201B, which is the first transistor, further includes an etching stopper layer 20, which is a first auxiliary insulation film covering the oxide semiconductor layer 12, which is the first oxide semiconductor layer.

In order to make contact between the source electrode 7 and the oxide semiconductor layer 12, a source contact hole 28 is formed through a part of the etching stopper layer 20. In order to make contact between the drain electrode 8 and the oxide semiconductor layer 12, a drain contact hole 29 is formed through a part of the etching stopper layer 20.

Therefore, the source electrode 7 can make contact with the exposed surface of the oxide semiconductor layer 12 via the source contact hole 28, and the drain electrode 8 can make contact with the exposed surface of the oxide semiconductor layer 12 via the drain contact hole 29.

The protective insulation film 14 is provided to cover the etching stopper layer 20, in addition to the oxide semiconductor layer 12, the source electrode 7, and the drain electrode 8.

Similarly to the pixel TFT 201 of the first preferred embodiment, the oxide semiconductor layer 12 of the pixel TFT 201B has the first structure having two types of reduction action regions 12Y formed by the oxide semiconductor layer 12 protruding outward in the channel width direction along the X direction in the channel portion 13 from both the source electrode 7 and the drain electrode 8. The two types of reduction action regions 12Y are composed of a source-side reduction action region and a drain-side reduction action region.

In the pixel TFT 201B, the etching stopper layer 20 contains a reductant so as to function as a reduction promotion layer, and is directly formed on the surface of the two types of reduction action regions 12Y of the oxide semiconductor layer 12. The etching stopper layer 30 also contains a reductant, and thus functions as a reduction promotion layer.

FIGS. 20B and 24 show that the oxide semiconductor layer 12 of the pixel TFT 201 has two types of reduction action regions protruding outward in the channel width direction from both the source electrode 7 and the drain electrode 8. However, the oxide semiconductor layer 12 of the pixel TFT 201 may have only one type of reduction action region 12X protruding outward in the channel width direction from one of the source electrode 7 and the drain electrode 8. That is, the requirement of the first structure can be satisfied as long as the oxide semiconductor layer 12 has one type of reduction action region of the source-side reduction action region and the drain-side reduction action region.

Accordingly, in the first structure, the oxide semiconductor layer 12 has at least one reduction action region in which a part of the oxide semiconductor layer 12 protrudes outward in the channel width direction of the channel portion 13 from at least one of the source electrode 7 and the drain electrode 8.

In general, the carrier concentration of the oxide semiconductor layers 12 and 25 changes under the influence of oxidation and reduction which the oxide semiconductor layer 12 has at the time of formation of the oxide TFT, and when reduced, the threshold voltage decreases due to an increase in the carrier concentration, and when oxidized, the threshold voltage increases due to a decrease in the carrier concentration.

In a TFT substrate 200B, which is an etching stopper TFT shown in the second preferred embodiment, the oxide semiconductor layer 25 and the oxide semiconductor layer 12 are protected by the etching stopper layer 30 and the etching stopper layer 20, respectively, and hence when the source electrode 23, the drain electrode 24, the source electrode 7, and the drain electrode 8 are formed by patterning the second conductive film 32 by wet etching or dry etching, damage given to the surfaces of the oxide semiconductor layer 25 and the oxide semiconductor layer 12 can be suppressed.

In the TFT substrate 200B of the second preferred embodiment, as a method of changing the carrier concentration of the oxide semiconductor layers 25 and 12, a reduction action by hydrogen diffusing from the etching stopper layers 30 and 20 to the oxide semiconductor layers 25 and 12 is used.

Generally, the etching stopper layer used in the oxide TFT is a silicon oxide ($SiO_2$) film, a silicon nitride (SiN) film, or a laminated film thereof formed by a CVD method, and since the etching stopper layer is formed of silane gas ($SiH_4$) as a material, hydrogen ($H_2$) is contained in the formed etching stopper layers 30 and 20. By diffusing this hydrogen into the oxide semiconductor layers 25 and 12, the oxide semiconductor layers 25 and 12 can be reduced.

As shown in the sectional views of the drive circuit TFT 211B of FIGS. 21 and 22, below the source electrode 7, the oxide semiconductor layer 25 is covered with the etching stopper layer 30 at a position except for the source contact hole 38 and the drain contact hole 39.

As shown in the sectional views of the pixel TFT 201B of FIGS. 23 and 24, below the drain electrode 8, the oxide semiconductor layer 12 is covered with the etching stopper layer 20 at a position except for the source contact hole 28 and the drain contact hole 29.

Hydrogen diffuses from the etching stopper layer 30 to the oxide semiconductor layer 25 via the exposed surface of the oxide semiconductor layer 25 in contact with the etching stopper layer 30. Similarly, hydrogen diffuses from the etching stopper layer 20 to the oxide semiconductor layer 12 via the exposed surface of the oxide semiconductor layer 12 in contact with the etching stopper layer 20.

At this time, the contact area between the oxide semiconductor layer 12 and the etching stopper layer 20 of the pixel TFT 201B shown in FIG. 20B is larger than the contact area between the oxide semiconductor layer 25 and the etching stopper layer 30 of the drive circuit TFT 211B shown in FIG. 20A by at least an excess amount of the reduction action region 12Y.

Therefore, the oxide semiconductor layer 12 of the pixel TFT 201B is reduced more to have a higher carrier concentration as compared to a case of the oxide semiconductor layer 25 of the drive circuit TFT 211B, and the first threshold voltage of the pixel TFT 201B is reliably lower than the second threshold voltage of the drive circuit TFT 211B.

Accordingly, even when the pixel TFT 201B and the drive circuit TFT 211B are formed on the same substrate 1 under the formation condition that the threshold voltage of the drive circuit TFT 211B becomes positive, the threshold voltage of the pixel TFT 201B can be selectively made negative.

Thus, the TFT substrate 200B according to the second preferred embodiment can be set to the first threshold voltage lower than the second threshold voltage because the TFT substrate 200B is additionally subjected to reduction action from the etching stopper layer 20, which is the first auxiliary insulation film functioning as the reduction promotion layer, via the reduction action region 12Y of the oxide semiconductor layer 12 in the pixel TFT 201B, which is the first transistor of the pixel portion.

In the TFT substrate 200B of the second preferred embodiment, by providing the etching stopper layers 20 and 30 covering the oxide semiconductor layers 12 and 25, damage given to the surfaces of the oxide semiconductor layer 25 and the oxide semiconductor layer 12 can be suppressed at the time of forming the source electrode 7, the drain electrode 8, the source electrode 23, and the drain electrode 24.

(Method for Manufacturing of Second Preferred Embodiment)

FIGS. 25A to 25D to FIGS. 29A to 29D are sectional views each showing a method for manufacturing the TFT substrate 200B of the second preferred embodiment. FIGS. 25A to 29A each show the region corresponding to the A2-A2 section of FIG. 20A, FIGS. 25B to 29B each show the region corresponding to the B2-B2 section of FIG. 20A, FIGS. 25C to 29C each show the region corresponding to the C2-C2 section of FIG. 20B, and FIGS. 25D to 29D each show the region corresponding to the D2-D2 section of FIG. 20B.

Hereinafter, a method for manufacturing the TFT substrate 200B according to the second preferred embodiment will be described with reference to FIGS. 25A to 25D to FIGS. 29A to 29D, focusing on the manufacturing processes of the pixel TFT 201B and the drive circuit TFT 211B.

First, the structure shown in FIGS. 16A to 16D is obtained through the same manufacturing method as in the first preferred embodiment.

Next, as shown in FIGS. 25A to 25D, the etching stopper layer 30 is formed on the substrate 1 so as to cover the oxide semiconductor layer 25, and the etching stopper layer 20 is formed on the substrate 1 so as to cover the oxide semiconductor layer 12. The etching stopper layer 30 and the etching stopper layer 20 are the same thing produced by the same process. In this description, reference numerals are assigned to the etching stopper layer 30 and the etching stopper layer 20 in order to distinguish between the drive circuit TFT 211B and the pixel TFT 201B.

For the etching stopper layer 30 and the etching stopper layer 20, for example, a silicon oxide (SiO) film formed by using a chemical vapor deposition method is used. Here, a 300 nm-thick SiO film is formed as the etching stopper layers 30 and 20 by using a silane ($SiH_4$) gas and a dinitrogen monoxide ($N_2O$) gas under a substrate heating condition of 150 to 400° C.

The SiO film has a low barrier property, that is, a low interruption property, with respect to impurity elements that affect TFT characteristics, such as water ($H_2O$), hydrogen ($H_2$), sodium (Na), and potassium (K). However, since the entire SiO film is covered with the protective insulation film 14 and the protective insulation film 27 after the formation of the source electrode 7, the source electrode 23, the drain electrode 8, and the drain electrode 24, there is no problem even if it is a single-layer SiO film.

The etching stopper layers 30 and 20 are silicon oxide ($SiO_2$) formed by the CVD method, and since the etching stopper layers 30 and 20 are formed of silane gas ($SiH_4$) as a material, hydrogen ($H_2$) is contained in the etching stopper layers 30 and 20.

This hydrogen diffuses into the oxide semiconductor layer 25 and the oxide semiconductor layer 12 from a contact portion between the etching stopper layer 30 and the oxide semiconductor layer 25 and a contact portion between the etching stopper layer 20 and the oxide semiconductor layer 12 during the formation of the etching stopper layers 30 and 20, or during the annealing treatment or the film forming process after this process. As a result, a part of the oxide semiconductor layer 25 and the oxide semiconductor layer 12 is reduced to increase the carrier concentration of the reduced portion.

At this time, as shown in FIG. 20B, the contact area between the oxide semiconductor layer 12 of the pixel TFT 201B and the etching stopper layer 20 is larger than the contact area between the oxide semiconductor layer 25 of the drive circuit TFT 211B and the etching stopper layer 30 shown in FIG. 20A by at least the amount of the additionally provided reduction action region 12Y.

Therefore, the oxide semiconductor layer 12 of the pixel TFT 201B is reduced more to have a higher carrier concentration as compared to a case of the oxide semiconductor layer 25 of the drive circuit TFT 211B, and consequently the first threshold voltage of the pixel TFT 201B is lower than the second threshold voltage of the drive circuit TFT 211B.

Thereafter, as shown in FIGS. 26A to 26D, the etching stopper layers 30 and 20 are patterned to separate into the etching stopper layer 30 and the etching stopper layer 20, thereby forming the source contact hole 38 and the drain contact hole 39 that partially penetrate the etching stopper layer 30, and forming the source contact hole 28 and the drain contact hole 29 that partially penetrate the etching stopper layer 20.

Next, as shown in FIGS. 27A to 27D, the second conductive film 32 is formed on the substrate 1, and is patterned to form the source electrode 23, the source electrode 7, the drain electrode 24, and the drain electrode 8, as shown in FIGS. 28A to 28D. At this time, a gap is formed above the etching stopper layer 30 and the etching stopper layer 20 formed on the channel portion 26 of the oxide semiconductor layer 25 and the channel portion 13 of the oxide semiconductor layer 12.

Since the etching stopper layer 30 and the etching stopper layer 20 are formed on the channel portion 26 and the channel portion 13, it is possible to reduce damage to the channel portion 26 and the channel portion 13 at the time of forming the source electrode 23, the drain electrode 24, the source electrode 7, and the drain electrode 8.

Here, as the second conductive film 32, for example, Al, Cr, Cu, Mo, an alloy in which another element is added to these elements in a small amount, or the like can be used. Alternatively, a laminated film on which two or more layers of these metals and alloys are formed may be used as a conductive film 8A (not shown). By using these metals and alloys, a low resistance film having a specific resistance value of 50 μΩcm or less can be obtained. The conductivity of the low resistance film may be, for example, $2 \times 10^4$ S/cm or more.

In the second preferred embodiment, an Mo film is used as the second conductive film 32, and the Mo film is formed to a thickness of 200 nm by a sputtering method using a publicly known Ar gas. Thereafter, a resist material is applied to the Mo film, a photoresist pattern (not shown) is formed in the photolithography, and the Mo film is selectively etched using the photoresist pattern as an etching mask and patterned. As a result, the source electrode 23, the drain electrode 24, the source electrode 7, and the drain electrode 8 can be formed.

In this etching, wet etching with a publicly known PAN solution can be used. Note that in the second preferred embodiment, a PAN solution containing 70 wt % of phosphoric acid, 7 wt % of acetic acid, 5 wt % of nitric acid, and water is used, and the Mo film is etched at a liquid temperature of 25° C.

Figure 28A:
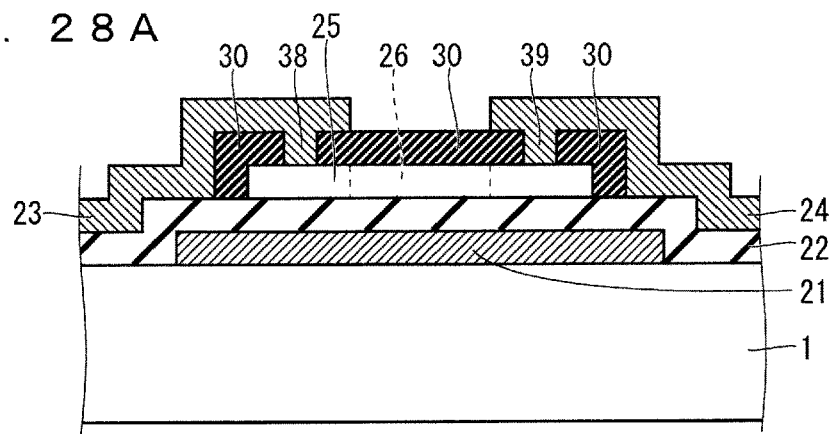
Figure 28B:
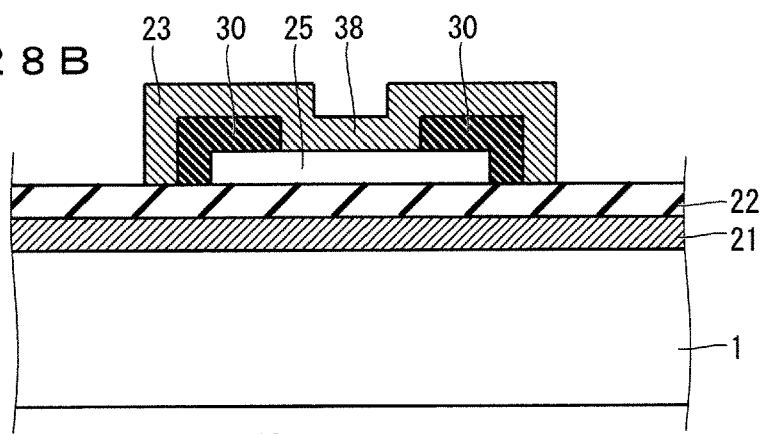

Thereafter, by removing the photoresist pattern, as shown in FIGS. 28A and 28B, the source electrode 23 and the drain electrode 24 electrically connected to the oxide semiconductor layer 25 via the source contact hole 38 and the drain contact hole 39 are formed.

Figure 28C:
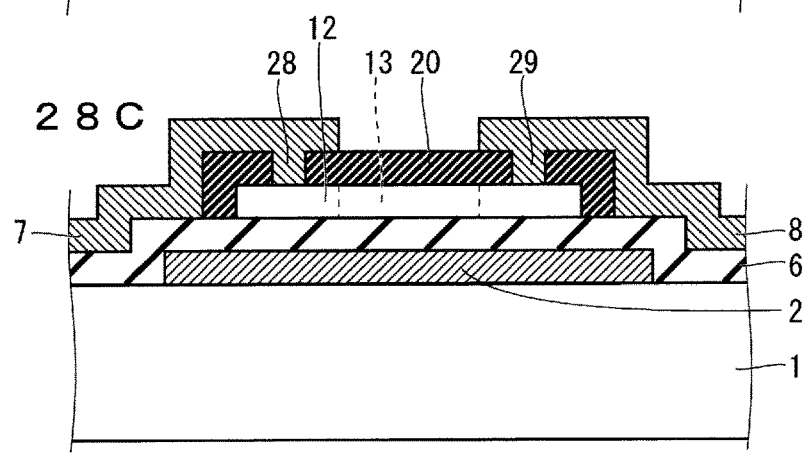
Figure 28D:
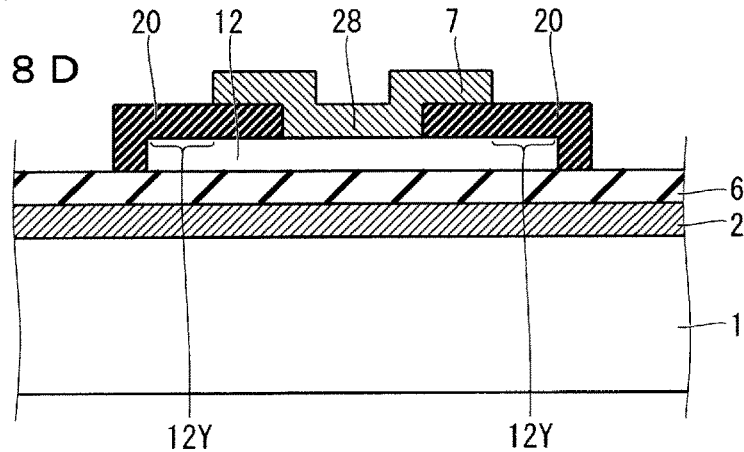

Similarly, by removing the photoresist pattern, as shown in FIGS. 28C and 28D, the source electrode 7 and the drain electrode 8 electrically connected to the oxide semiconductor layer 12 via the source contact hole 28 and the drain contact hole 29 are formed.

In the drive circuit TFT 211B, as shown in FIGS. 20A and 28B, the oxide semiconductor layer 25 is partially covered over the entire channel width direction by the source electrode 23 and the drain electrode 24 via the etching stopper layer 30.

That is, the oxide semiconductor layer 25 has the second structure formed without protruding outward in the channel width direction of the channel portion 26 from the source electrode 23 and the drain electrode 24.

On the other hand, in the pixel TFT 201B, as shown in FIGS. 20B and 28D, the oxide semiconductor layer 12 has the two types of reduction action regions 12Y protruding outward in the channel width direction from both the source electrode 7 and the drain electrode 8 via the etching stopper layer 20. That is, the oxide semiconductor layer 12 of the pixel TFT 201B has the first structure that has the two types of reduction action regions 12Y constituted with the source-side reduction action region and the drain-side reduction action region.

The oxide semiconductor layer 12 may have at least one type of reduction action region of the source-side reduction action region and the drain-side reduction action region.

That is, if the oxide semiconductor layer 12 has at least one type of reduction action region in which a part of the oxide semiconductor layer 12 protrudes outward in the channel width direction of the channel portion 13 from at least one of the source electrode 7 and the drain electrode 8, the requirement of the first structure can be satisfied.

Next, as shown in FIGS. 29A to 29D, the protective insulation film 27 and the protective insulation film 14 are formed so as to cover the etching stopper layer 30 and the etching stopper layer 20 in addition to the source electrode 23, the source electrode 7, the drain electrode 24, the channel portion 26 of the oxide semiconductor layer 25, and the channel portion 13 of the oxide semiconductor layer 12.

The protective insulation films 27 and 14 are obtained by forming a 300 nm-thick SiO film using the CVD method under the condition that the substrate 1 is heated within a temperature range of 150 to 400° C., for example. The SiO film has a low barrier property, that is, a low interruption property, with respect to impurity elements that affect TFT characteristics, such as water ($H_2O$), hydrogen ($H_2$), sodium (Na), and potassium (K). For this reason, a laminated film in which a silicon nitride (SiN) film or the like having an excellent barrier property is provided under the SiO film may be used as the protective insulation films 27 and 14.

In a normal TFT formation process, although not shown, a resist material is applied on the protective insulation film 27 and the protective insulation film 14, a photoresist pattern is formed in the photolithography, and a silicon oxide film is selectively etched using the photoresist pattern as an etching mask to form a contact hole. In this etching, a publicly known dry etching method using fluorine gas can be used.

Next, although not shown, the conductive film 11A is formed as the third conductive film on the substrate 1, and the pixel drain contact hole 15, the gate terminal portion contact hole 16, and the source terminal portion contact hole 17 are built therein.

A transparent conductive film is formed as the conductive film 11A. As the transparent conductive film in the second preferred embodiment, an InZnO film as a publicly known conductive oxide having a mixing ratio of indium oxide ($In_2O_3$) and zinc oxide (ZnO) of 90:10 by weight % is used.

Here, an InZnO film having a thickness of 100 nm is formed by a publicly known sputtering method. However, the transparent conductive film is not limited to the IZO film described above, and an ITO film or the like can also be used.

Thereafter, a resist material is applied to the conductive film 11A, a photoresist pattern (not shown) is formed in the photolithography, and the conductive film 11A is selectively etched using the photoresist pattern as an etching mask and patterned. Thereafter, by removing the photoresist pattern, as shown in FIG. 4, the transmissive pixel electrode 11, the gate terminal pad 18, and the source terminal pad 19 are formed, and the TFT substrate 200B according to the second preferred embodiment is completed.

In this etching, wet etching with a publicly known oxalic acid solution can be used.

The reason of use of a transparent conductive film for the conductive film 11A is that, in a transmissive LCD for selectively transmitting and displaying light from the backlight unit, it is necessary to form a transmissive pixel electrode. On the other hand, in a reflective LCD for selectively reflecting external light for display, a metal film such as Al and silver for reflecting light may be formed as a pixel electrode. In the case of a semi-transmissive LCD having both reflective and transmissive characteristics, a pixel electrode having both light reflective characteristics and light transmissive characteristics may be formed.

In the TFT substrate 200B according to the second preferred embodiment thus formed, the carrier concentration of the oxide semiconductor layer 25 of the drive circuit TFT 211B is in the range of $1\times10^{11}$ to $1\times10^{14}$/cm$^3$, and the carrier concentration of the oxide semiconductor layer 12 of the pixel TFT 201B is in the range of $1\times10^{12}$ to $1\times10^{16}$/cm$^3$. As a result, the drive circuit TFT 211B can be manufactured such that the second threshold voltage becomes positive and the pixel TFT 201B can be manufactured such that the first threshold voltage becomes negative.

In the second preferred embodiment, the carrier concentrations of the drive circuit TFTs 211B and the pixel TFTs 201B are adjusted by a reduction action due to the diffusion of hydrogen during the formation of the etching stopper layer 30 and the etching stopper layer 20, but the diffusion of hydrogen may be promoted by the film forming process after the formation of the etching stopper layer 30 and the etching stopper layer 20 or an annealing treatment, in addition to the film forming processes of the etching stopper layer 30 and the etching stopper layer 20.

Thus, in the method for manufacturing the TFT substrate 200B, the oxide semiconductor layer formation process for forming the oxide semiconductor layers 25 and 12 shown in FIGS. 15A to 15D and FIGS. 16A to 16D of the first preferred embodiment and the electrode formation process for forming the source electrode 23, the source electrode 7, the drain electrode 24, and the drain electrode 8 shown in FIGS. 27A to 27D and FIGS. 28A to 28D are performed so as to satisfy the following conditions (1) and (2).

Condition (1): The oxide semiconductor layer 12, which is the first oxide semiconductor layer, has the first structure having the two types of reduction action regions 12Y constituted with the source-side reduction action region and the drain-side reduction action region.

Condition (2): The oxide semiconductor layer 25, which is the second oxide semiconductor layer, has the second structure having no region corresponding to the reduction action region 12Y. That is, the oxide semiconductor layer 25 has the second structure not having the source-side reduction action region and the drain-side reduction action region.

An etching stopper formation process for forming the etching stopper layer 30 and the etching stopper layer 20 shown in FIGS. 25A to 25D and FIGS. 26A to 26D is performed so as to satisfy the following condition (3).

Condition (3): The etching stopper layer 20, which is the first auxiliary insulation film functioning as the reduction promotion layer, is formed directly on the surfaces of the two types of reduction action regions 12Y.

As a result, in the method for manufacturing the TFT substrate 200B according to the second preferred embodiment, the pixel TFT 201B and the drive circuit TFT 211B can be formed on the same substrate 1 by performing the oxide semiconductor layer formation process, the etching stopper formation process, and the electrode formation process that are common between the pixel TFT 201B and the drive circuit TFT 211B such that the first threshold voltage of the pixel TFT 201B is reliably lower than the second threshold voltage of the drive circuit TFT 211B.

In order to satisfy the condition (3), the TFT substrate 200B can be set to the first threshold voltage lower than the second threshold voltage in the etching stopper layer formation process for forming the etching stopper layers 30 and 20 shown in FIGS. 26A to 26D, because the two types of reduction action regions 12Y of the oxide semiconductor layer 12 of the pixel TFT 201B are subjected to reduction action from the etching stopper layer 20 having therein hydrogen as a reductant.

In the TFT substrate 200B of the second preferred embodiment, by providing the etching stopper layers 20 and 30 covering the oxide semiconductor layers 12 and 25, damage given to the surfaces of the oxide semiconductor layer 25 and the oxide semiconductor layer 12 can be suppressed at the time of performing the electrode formation process for forming the source electrode 7, the drain electrode 8, the source electrode 23, and the drain electrode 24 shown in FIGS. 27A to 27D and FIGS. 28A to 28D.

In addition, since the pixel TFT 201B of the second preferred embodiment has the first structure having the two types of reduction action regions 12Y composed of the source-side reduction action region and the drain-side reduction action region, the first threshold voltage can be lowered as compared to a case where only one type of the source-side reduction action region and the drain-side reduction action region is formed.

The completed TFT substrate 200B corresponds to the TFT substrate 1004 of FIG. 1, and an alignment film and a spacer (not shown) are formed on the surface thereof. The alignment film is a film for aligning liquid crystal molecules and is composed of polyimide or the like. The counter substrate 1006 shown in FIG. 1 having a color filter and an alignment film is prepared, and the TFT substrate 1004 and the counter substrate 1006 are bonded to each other. Then, the liquid crystal is injected and held into the gap formed between the two substrates by the spacer. Thereafter, the polarizing plates 1003 and 1007 are disposed on the outside of both substrates, the backlight unit is disposed on further outside of the TFT substrate 1004, and a retardation plate is disposed on further outside of the counter substrate 1006. Thus, the liquid crystal display 1000 having the configuration shown in FIG. 1 can be obtained by using the TFT substrate 200B according to the second preferred embodiment as the TFT substrate 1004.

The TFT substrate 200B according to the second preferred embodiment described above may be used in a display apparatus other than a liquid crystal display. For example, the present invention can be applied to an electro-optical display apparatus such as an organic EL display. The pixel TFT 201B may be used as a thin film transistor used in a semiconductor device other than the electro-optical display apparatus or as a thin film transistor of an active matrix substrate other than the electro-optical display apparatus.

(Liquid Crystal Display 1000)

As described above, the liquid crystal display 1000 shown in FIG. 1 is configured as a display apparatus including the TFT substrate 200 according to the first preferred embodiment or the TFT substrate 200B according to the second preferred embodiment.

That is, the liquid crystal display 1000 is configured to include, as main components, the TFT substrate 1004 that is the TFT substrate 200 of the first preferred embodiment or the TFT substrate 200B of the second preferred embodiment, the counter substrate 1006 arranged to face the TFT substrate 1004, and the liquid crystal layer 1005 sandwiched between the TFT substrate 1004 and the counter substrate 1006.

The liquid crystal display 1000 can exhibit good electrical characteristics by using, as a component, the TFT substrate 200 in which the first threshold voltage of the pixel TFT 201 is lower than the second threshold voltage of the drive circuit TFT 211, or the TFT substrate 200B in which the first threshold voltage of the pixel TFT 201B is lower than the second threshold voltage of the drive circuit TFT 211B.

In the present invention, each of the preferred embodiments can be freely combined or each of the preferred embodiments can be modified or omitted as appropriate within the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A thin film transistor substrate, comprising:
    a pixel portion that is provided on a substrate; and
    a drive circuit that is provided on the substrate and generates a pixel drive signal for driving the pixel portion, wherein:
    the pixel portion includes a first transistor for pixel selection, and the drive circuit includes a second transistor for generating the pixel drive signal;
    the first transistor includes
    a first gate electrode that is provided on the substrate,
    a first gate insulation film that is provided to cover the first gate electrode, and
    a first oxide semiconductor layer that is provided on the first gate insulation film;
    the first oxide semiconductor layer is provided at a position facing the first gate electrode via the first gate insulation film, the first transistor further including:
    a first source electrode that is provided in contact with a part of a surface of the first oxide semiconductor layer, and
    a first drain electrode that is provided in contact with a part of the surface of the first oxide semiconductor layer, and apart from the first source electrode, wherein:
    a region of the first oxide semiconductor layer between the first source electrode and the first drain electrode is defined as a first channel region;
    the first oxide semiconductor layer has a first structure having a reduction action region in which a part of the first oxide semiconductor layer protrudes outward in a channel width direction of the first channel region from at least one electrode of the first source electrode and the first drain electrode;
    the first transistor further including:
    a reduction promotion layer that contains a reductant and is formed directly on at least a surface of the reduction action region;
    the second transistor includes
    a second gate electrode that is provided on the substrate,
    a second gate insulation film that is provided to cover the second gate electrode, and
    a second oxide semiconductor layer that is provided on the second gate insulation film;
    the second oxide semiconductor layer is provided at a position facing the second gate electrode via the second gate insulation film, the second transistor further including:
    a second source electrode that is provided in contact with a part of a surface of the second oxide semiconductor layer, and
    a second drain electrode that is provided in contact with a part of the surface of the second oxide semiconductor layer, and apart from the second source electrode, wherein:
    a region of the second oxide semiconductor layer between the second source electrode and the second drain electrode is defined as a second channel region; and
    the second oxide semiconductor layer has a second structure formed without protruding outward in a channel width direction of the second channel region from the second source electrode and the second drain electrode.

2. The thin film transistor substrate according to claim 1, wherein:
    the first transistor further includes
    a first protective insulation film that is provided to cover the first oxide semiconductor layer, the first source electrode, and the first drain electrode, wherein:
    the first protective insulation film is formed directly on a surface of the reduction action region;
    the second transistor further includes
    a second protective insulation film that is provided to cover the second oxide semiconductor layer, the second source electrode, and the second drain electrode, wherein:
    the reduction promotion layer includes the first and second protective insulation films.

3. The thin film transistor substrate according to claim 1, wherein:
    the first transistor further includes
    a first auxiliary insulation film that is provided to cover the first oxide semiconductor layer, wherein:
    the first source electrode and the first drain electrode each penetrate a part of the first auxiliary insulation film and makes contact with a part of a surface of the first oxide semiconductor layer;
    the second transistor further includes
    a second auxiliary insulation film that is provided to cover the second oxide semiconductor layer, wherein:
    the second source electrode and the second drain electrode each penetrate a part of the second auxiliary insulation film and makes contact with a part of a surface of the second oxide semiconductor layer; and
    the reduction promotion layer includes the first and second auxiliary insulation films.

4. The thin film transistor substrate according to claim 1, wherein:
    the reduction action region in the first structure includes a region that is formed by the first oxide semiconductor layer protruding outward in the channel width direction of the first channel region from both the first source electrode and the first drain electrode.

5. A display apparatus, comprising:
the thin film transistor substrate according to claim 1;
a counter substrate that is arranged facing the thin film transistor substrate; and
a liquid crystal layer that is sandwiched between the thin film transistor substrate and the counter substrate.

6. A method for manufacturing a thin film transistor substrate, wherein:
the thin film transistor substrate includes a pixel portion that is provided on a substrate, and a drive circuit that is provided on the substrate and generates a pixel drive signal for driving the pixel portion;
the pixel portion includes a first transistor for pixel selection, and the drive circuit includes a second transistor for generating the pixel drive signal;
a process of manufacturing the first and second transistors includes the steps of:
(a) selectively forming a first and second gate electrodes on the substrate;
(b) forming a first and second gate insulation films so as to cover the first and second gate electrodes; and
(c) forming a first and second oxide semiconductor layers on the first and second gate insulation films, wherein: the first and second oxide semiconductor layers are provided at positions facing the first and second gate electrodes via the first and second gate insulation films, the process further includes the steps of:
(d) forming a first and second source electrodes in contact with a part of the surfaces of the first and second oxide semiconductor layers; and
(e) forming a first and second drain electrodes in contact with a part of surfaces of the first and second oxide semiconductor layers, and apart from the first and second source electrodes, wherein: a region of the first oxide semiconductor layer between the first source electrode and the first drain electrode is defined as a first channel region, and a region of the second oxide semiconductor layer between the second source electrode and the second drain electrode is defined as a second channel region;
the step (c), the step (d), and the step (e) are performed such that
the first oxide semiconductor layer has a first structure having a reduction action region in which a part of the first oxide semiconductor layer protrudes outward in a channel width direction of the first channel region from at least one electrode of the first source electrode and the first drain electrode; and
the second oxide semiconductor layer has a second structure formed without protruding outward in a channel width direction of the second channel region from the second source electrode and the second drain electrode,
the process further includes the step of
(f) forming a reduction promotion layer that has a reductant in the reduction promotion layer at least on a surface of the reduction action region.

7. The method according to claim 6, wherein:
the step (f) includes the steps of
(f-1) forming a first protective insulation film to cover the first oxide semiconductor layer, the first source electrode, and the first drain electrode; and
(f-2) forming a second protective insulation film to cover the second oxide semiconductor layer, the second source electrode, and the second drain electrode, wherein the step (f-1) and the step (f-2) are simultaneously performed, and after the step (f-1) is performed, the first protective insulation film is formed directly on a surface of the reduction action region; and
the reduction promotion layer includes the first and second protective insulation films.

8. The method according to claim 6, wherein:
the step (f) is performed after the step (c) and before the step (d) and the step (e), the step (f) including the steps of:
(f-1) forming a first auxiliary insulation film to cover the first oxide semiconductor layer; and
(f-2) forming a second auxiliary insulation film to cover the second oxide semiconductor layer, wherein: the step (f-1) and the step (f-2) are simultaneously performed, and after the step (f-1) is performed, the first auxiliary insulation film is formed directly on a surface of the reduction action region;
the reduction promotion layer includes the first and second auxiliary insulation films;
the step (d) includes
a step of forming the first and second source electrodes in contact with a part of surfaces of the first and second oxide semiconductor layers by penetrating a part of the first and second auxiliary insulation films; and
the step (e) includes
a step of forming the first and second drain electrodes in contact with a part of surfaces of the first and second oxide semiconductor layers by penetrating a part of the first and second auxiliary insulation films.

9. The method according to claim 6, wherein:
the reduction action region in the first structure includes a region that is formed by the first oxide semiconductor layer protruding outward in the channel width direction of the first channel region from both the first source electrode and the first drain electrode.

* * * * *